(12) United States Patent
Popovic et al.

(10) Patent No.: US 10,250,430 B2
(45) Date of Patent: Apr. 2, 2019

(54) TRANSMISSION AND RECEIVING METHOD IN A WIRELESS COMMUNICATION SYSTEM

(71) Applicant: HUAWEI TECHNOLOGIES CO., LTD., Shenzhen, Guangdong (CN)

(72) Inventors: Branislav M. Popovic, Kista (SE); Alberto Giuseppe Perotti, Segrate (IT)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/162,922

(22) Filed: May 24, 2016

(65) Prior Publication Data
US 2016/0269214 A1 Sep. 15, 2016

Related U.S. Application Data

(63) Continuation of application No. PCT/EP2013/075150, filed on Nov. 29, 2013.

(51) Int. Cl.
*H04L 1/00* (2006.01)
*H03M 13/00* (2006.01)
(Continued)

(52) U.S. Cl.
CPC ...... *H04L 27/3416* (2013.01); *H03M 13/256* (2013.01); *H03M 13/2739* (2013.01);
(Continued)

(58) Field of Classification Search
CPC ............ H03M 13/6325; H03M 13/256; H04L 27/3416; H04L 1/006; H04L 1/0071
See application file for complete search history.

(56) References Cited

U.S. PATENT DOCUMENTS

| | | | | |
|---|---|---|---|---|
| 6,088,387 A | * | 7/2000 | Gelblum | H04L 1/0003 375/222 |
| 7,688,900 B2 | * | 3/2010 | Wengerter | H03M 13/2742 370/320 |

(Continued)

FOREIGN PATENT DOCUMENTS

| | | |
|---|---|---|
| CN | 1231565 A | 10/1999 |
| CN | 1350406 A | 5/2002 |

(Continued)

OTHER PUBLICATIONS

P. Chevillat, "N-user trellis coding for a class of multiple-access channels", IEEE Trans. Inf. Theory, vol. 27, Jan. 1981.*

(Continued)

*Primary Examiner* — Sam K Ahn
*Assistant Examiner* — Amneet Singh
(74) *Attorney, Agent, or Firm* — Fish & Richardson P.C.

(57) ABSTRACT

The present patent application relates to a transmission method and corresponding receiving methods. The transmission method comprises: selecting K number of data streams for transmission, wherein each data stream comprises one or more data messages; and independently for each data stream $k=0, \ldots, K-1$: encoding and modulating data messages of the kth data stream using a Trellis Coded Modulation, TCM, scheme $TCM_k$, interleaving the encoded and modulated data messages of the k-th data stream by using a stream specific interleaver $\Pi_k$, scrambling the interleaved data messages of the k-th data stream by using a stream specific scrambling sequence; combining all scrambled data messages of the K number of data streams into at least one transmission signal s(l); and transmitting the at least one transmission signal s(l) over a radio channel of the wireless communication system.

20 Claims, 17 Drawing Sheets

(51) Int. Cl.
    *H03M 13/25*     (2006.01)
    *H03M 13/27*     (2006.01)
    *H03M 13/29*     (2006.01)
    *H04L 27/34*     (2006.01)

(52) U.S. Cl.
    CPC ... *H03M 13/2957* (2013.01); *H03M 13/6325* (2013.01); *H04L 1/006* (2013.01); *H04L 1/0047* (2013.01); *H04L 1/0071* (2013.01)

(56) References Cited

U.S. PATENT DOCUMENTS

| | | | |
|---|---|---|---|
| 2002/0037056 A1 | 3/2002 | Choi et al. | |
| 2003/0043928 A1* | 3/2003 | Ling | H04B 7/0417 375/267 |
| 2003/0110440 A1* | 6/2003 | Gutierrez, Jr. | H04L 1/0003 714/790 |
| 2004/0057531 A1* | 3/2004 | Rooyen | H04L 1/006 375/267 |
| 2007/0025321 A1* | 2/2007 | Padovani | H04B 7/264 370/347 |
| 2007/0286313 A1 | 12/2007 | Nikopour-Deilami | |
| 2009/0132872 A1* | 5/2009 | Leung | H03M 13/27 714/701 |
| 2010/0195712 A1* | 8/2010 | Yu | H04N 19/61 375/240.01 |
| 2010/0310002 A1* | 12/2010 | Lauer | H04L 1/0026 375/267 |
| 2010/0310003 A1* | 12/2010 | Lauer | H04L 27/2601 375/267 |
| 2012/0263090 A1* | 10/2012 | Porat | H04L 1/0003 370/312 |
| 2012/0314676 A1* | 12/2012 | Koo | H04B 7/0452 370/329 |

FOREIGN PATENT DOCUMENTS

| | | |
|---|---|---|
| CN | 1533067 A | 9/2004 |
| CN | 101841339 A | 9/2010 |
| CN | 101848002 A | 9/2010 |
| EP | 1041756 A2 | 10/2000 |
| JP | 2008-509621 A | 3/2008 |
| JP | 2000-341247 A | 12/2012 |
| WO | 2006/016320 A1 | 2/2006 |

OTHER PUBLICATIONS

M. Griot, A. I. Vila Casado, W.- Y. Weng, H. Chan, J. Basak, E. Yablanovitch, I Verbauwhede, B. Jalali, R. D. Wesel, "Trellis codes with low ones density for the OR multiple access channel", Proc. 2006 IEEE International Symp. Inf. Theory.*

R. Balsdon and J. How, "Trellis-Coded Multiple-Access using chirp signalling," 2010 4th International Conference on Signal Processing and Communication Systems, Gold Coast, QLD, 2010, pp. 1-8.*

A. G. Perotti and B. M. Popović, "Enhanced trellis coded multiple access (ETCMA)," 2014 IEEE Information Theory Workshop (ITW 2014), Hobart, TAS, 2014, pp. 471-475.*

T. Aulin, R. Espineira, "Trellis coded multiple access (TCMA)", IEEE Int. Conf. Commun. ICC 1999 vol. 2, vol. 2, pp. 1177-1181, 1999.*

XP31352544. Nicholas Bonello et al., "Channel Code-Division Multiple Access and Its Multilevel-Structured LDPC-Based Instantiation," IEEE Transactions on Vehicular Technology, Sep. 21, 2008, total 5 pages.

XP32363585, A. Mary Juliet et al., "Design Analysis of Deterministic Interleaver for OFDM-IDMA System," 2013 International Conference on Signal Processing, Image Processing and Pattern Recognition [ICSIPR], Feb. 7, 2013, total 5 pages.

XP11070998. Fredrik Brännström et al., "Iterative Detectors for Trellis-Code Multiple-Access," IEEE Transactions on Communications 50(9):1478-85 (Sep. 2002) total 8 pages.

XP32421076. M. Shashidhari et al., "Performance analysis of IDMA receiver for efficient power optimization using HSPA technology," 2013 International Conference on Communication Systems and Network Technologies (Apr. 6, 2013) total 5 pages.

XP11189162. Li Ping et al., "The OFDM-IDMA approach to wireless communication systems," IEEE Wireless Communications 14(3):18-24 (Jun. 1, 2007) total 9 pages.

3GPP TS 36.211 V8.2.0 (Mar. 2008),3rd Generation Partnership Project;Technical Specification Group Radio Access Network;Evolved Universal Terrestrial Radio Access (E-UTRA);Physical Channels and Modulation(Release 8),total 65 pages.

3GPP TS 36.211 V8.3.0 (May 2008),3rd Generation Partnership Project;Technical Specification Group Radio Access Network:Evolved Universal Terrestrial Radio Access (E-UTRA);Physical Channels and Modulation(Release 8),total 77 pages.

3GPP TS 36.211 V8.4.0 (Sep. 2008),3rd Generation Partnership Project;Technical Specification Group Radio Access Network:Evolved Universal Terrestrial Radio Access (E-UTRA);Physical Channels and Modulation(Release 8),total 78 pages.

* cited by examiner

Alternative Transmission Device

TRANSMISSION AND RECEIVING METHOD IN A WIRELESS COMMUNICATION SYSTEM

CROSS-REFERENCE TO RELATED APPLICATIONS

This application is a continuation of International Application No. PCT/EP2013/075150, filed on Nov. 29, 2013, which is hereby incorporated by reference in its entirety.

TECHNICAL FIELD

The present patent application relates to a transmission method and corresponding receiving methods in a wireless communication system. Furthermore, the patent application also relates to a transmission device, receiver devices, a computer program, and a computer program product thereof.

BACKGROUND

The electromagnetic (radio) spectrum is a scarce and precious resource whose efficient use is crucial for present and future wireless communication systems. Fourth-generation wireless systems already target very high per-user data rates. The goal of future transmission systems is not necessarily to increase it, but rather to achieve increased spectral efficiencies in order to be able to deliver higher aggregate data rates to larger numbers of simultaneously communicating users.

Multiple Access (MA) schemes are used to make a shared communication channel simultaneously available to several users or data streams. Next generation wireless systems will have to face the demand for higher aggregate data rates while being capable of providing reliable communication to many simultaneous users and/or applications. Such high data rates will be achieved by an increasingly efficient use of the channel's physical resources.

It would be beneficial to devise non-orthogonal schemes that achieve higher aggregate spectral efficiencies while in the same time have SNR losses as small as possible with respect to the single-stream performance. Additionally, such schemes should outperform the best cellular systems (e.g., LTE) in terms of spectral efficiency for a given amount of assigned resources.

TCMA, with its low single-user SNR loss, is a very promising technique. However, its aggregate SE is still far from the AWGN channel capacity, especially when the number of streams is high.

Overloading is a paradigm according to which, in a transmission system, several data streams are multiplexed onto the same time-frequency-space Resource Elements (RE), thus resulting in increased data rates. Applying the overloading concept to the MA context, Overloaded Multiple Access (OMA) schemes have been conceived which are able to provide significantly higher Spectral Efficiency (SE) than conventional MA schemes.

Based on the Domain of Separation (DoS) of users/streams, the following classification of OMA schemes can be made:

1) Power DoS: e.g. Non-Orthogonal Multiple Access (NOMA) schemes. Here, a far user and a near user are multiplexed on the same time-frequency-space REs. The scheme is based on the transmission of superposed signals with different amplitudes.

2) Constellation DoS: e.g., Constellation Expansion Multiple Access (CEMA). Here, subsets of constellation symbols are allocated to different users/streams.

3) Spreading Sequences DoS: e.g., Low Density Spread (LDS) CDMA, LDS-OFDM. These schemes are based on the allocation of different sparse sequences to different users/streams.

4) Spread Superposition Codebooks DoS: e.g., LDS-CDMA, LDS-OFDM, Sparse Coded Multiple Access (SCMA), Interleave-Division Multiple Access (IDMA). These schemes are based on user-specific spreading and modulation codebooks that aim to maximize the minimum Euclidean distance between the sparse spread signals of different users/streams.

5) Non-Spread Superposition Codebooks DoS: e.g., Trellis Coded Multiple Access (TCMA). This scheme is based on Trellis-Coded Modulation (TCM) with stream-specific interleaving, resulting in stream-specific non-spread codebooks.

The increased SE of any OMA scheme is achieved at the expense of increased required transmit power for each multiplexed stream/user, in order to mitigate the degradations caused by the non-ideal performance of the multi-stream detector in the receiver. This increase of transmit power can be characterized by the so-called single-stream Signal-to-Noise Ratio (SNR) loss, a feature that is defined as a function of the aggregate Spectral Efficiency (SE) which is defined as $$SE(K)=(1-BLER)Rm_0K \text{ [bits/s/Hz]}. \quad (1)$$

Here, BLER indicates the block error rate, R is the channel code rate, $m_0$ is the modulation order in bits per symbol and K is the overloading factor, which coincides with the number of streams in TCMA systems. The spectral efficiency is a function of the SNR: we indicate with $$SE_\infty(K)=\lim_{SNR\to\infty}SE(K) \quad (2)$$

the Asymptotic Aggregate Spectral Efficiency (ASE). The relevant metric we take into account for evaluation is the single-stream SNR loss $\Delta_{SNR}(K, \rho)$, which is the increase of SNR with respect to the single-stream SNR required by the receiver to achieve a given ratio $\rho$ of the ASE when the overloading factor is K>1.

$$\Delta_{SNR}(K,\rho)=SNR(SE(K)=\rho SE_\infty(K))- SNR(SE(1)=\rho SE_\infty(1)). \quad (3)$$

In FIG. 1, the normalized SE ($SE(K)/SE_\infty(K)$) of the TCMA scheme is shown as well as the single-stream SNR losses $\Delta_{SNR}(K, \rho)$ for $\rho=0.9$ and K=2, ..., 7. Table 1 summarizes the single-stream SNR losses $\Delta_{SNR}(K, 0.9)$ of the TCMA system.

TABLE 1

Single-stream SNR loss of the TCMA scheme

| K | $\Delta_{SNR}$ (K, 0.9) |
|---|---|
| 2 | 0.6 dB |
| 3 | 3.4 dB |
| 4 | 6.75 dB |
| 5 | 10.45 dB |
| 6 | 14.25 dB |
| 7 | 18.8 dB |

The aforementioned OMA techniques have been evaluated and compared. The resulting considerations are summarized in Table 2. We observe that, among the considered systems, TCMA is the one that features the smallest single-stream SNR loss. In fact, when K=2 streams are concurrently transmitted, its SE is close to the single-stream case (K=1) within a single-user SNR loss of 0.6 dB. Moreover, for K>2 the single-stream SNR loss is moderate. Such attractive characteristic makes TCMA schemes the best candidates for further development.

TABLE 2

Comparison of known overloaded multiple access schemes

| | Pros | Cons |
|---|---|---|
| NOMA | Low complexity | Only two users/streams, with large SNR gap between them as the major prerequisite Applicable only on DL |
| CEMA | Relatively small single user SNR loss Low complexity | Limited flexibility (number of users is function of available constellation sizes and user data/code rates) Applicable only on DL |
| LDS-CDMA | Moderate MUD complexity Applicable both on UL and DL Backward-compatible on DL | Moderate single user SNR loss |
| SCMA | Moderate MUD complexity Applicable both on UL and DL | Not backward compatible Similar single user SNR loss as in LDS-CDMA Difficult to design transmission codebooks when loads are larger than 1.5 |
| TCMA | Smallest single-stream SNR loss for the two-stream case Applicable both on UL and DL | Receiver complexity Not backward-compatible |

TCMA schemes have been proposed in the UL context, where multiple devices (e.g., User Equipments, UEs) concurrently transmit their encoded, modulated and interleaved data streams. Each device transmits one data stream and all transmissions are simultaneous, i.e., the same time-frequency-space REs are used by all devices. It is also assumed that all transmissions are symbol-synchronous and that ideal power control is implemented, such that all user signals have the same average power when they reach the receiver antenna.

Each stream is independently encoded and modulated using the well-known Trellis-Coded Modulation (TCM) scheme. Before transmission, the modulated symbols are interleaved according to a stream-specific permutation.

In TCMA, each stream may be encoded and modulated using different trellis codes and modulation schemes; these stream-specific features help the receiver to separate the information belonging to different streams. However, most effective feature for stream separation is the use of stream-specific interleavers.

A scheme representing the TCMA transmission concept is shown in FIG. 2, where stream-specific interleavers are indicated with Π. Further FIG. 3 shows an example of TCM encoder-modulator consisting of a four-state convolutional encoder connected to a QPSK symbol mapper.

Thanks to the linear characteristic of the wireless channel, the received signal is the sum of concurrently transmitted signals. It is a task of the receiver to separate the signals belonging to different streams, then to perform demodulation and decoding and finally delivering the information to recipients.

An iterative TCMA receiver has been proposed in the art. Although featuring a rather high complexity, such receiver results in a good performance. Nevertheless, as will be shown in the following, the performance of the resulting scheme still exhibits a large gap with respect to the AWGN channel capacity.

FIG. 4 shows the block scheme of a TCMA receiver according to prior art. The received signal (4) is the sum of the transmitted signals, plus additive white Gaussian noise w(l):

$$r(l) = \sum_{k=0}^{K-1} e^{j\theta_k(l)} s_k(l) + w(l) \quad (4)$$

where the coefficients $e^{j\theta_k(l)}$ are introduced to model carrier phase and frequency offsets between different transmitters. Motivated by the presence of interleavers in the transmission system, coefficients $e^{j\theta_k(l)}$ have been assumed to exhibit a uniformly distributed random phase.

In the TCMA receiver, the TCM decoders and Multi Stream Detector (MSD) interact through the interleavers in an iterative fashion by exchanging soft information referred to coded bits $d_k^{(1)}(l)$ and $d_k^{(2)}(l)$. Such soft information may consist of probability distributions, logarithms of probability distributions, Likelihood Radios (LRs) or Logarithms of Likelihood Ratios (LLRs). In the following, a brief description of the MSD will be given using probability distributions.

The task of the MSD consists in the separation of information belonging to different streams. The MSD computes the joint probability distribution $P(d(l)|r(l))=P(d_0^{(1)}(l), d_0^{(2)}(l), \ldots, d_{K-1}^{(1)}(l), d_{K-1}^{(2)}(l)|r(l))$, a task whose complexity grows exponentially with the number of streams K. In fact, the domain of such function is $d(l) \in \{0,1\}^{2K}$.

At each iteration and for each k-th stream, the MSD computes the marginal probabilities $g_k^{(1)}(l)=P(d_k^{(1)}(l)=0|r(l))$ and $g_k^{(2)}(l)=P(d_k^{(2)}(l)=0|r(l))$ and sends them to the TCM decoder through the deinterleaver $\Pi_k^{-1}$.

The TCM decoder updates such probabilities according to the TCM code constraints. Typically, an algorithm that operates according to the trellis of the corresponding convolutional encoder is executed. Well known algorithms for trellis decoding include the Viterbi algorithm and the Bahl-Cocke-Jelinek-Raviv (BCJR) algorithm. The TCM decoder obtains improved probabilities $h_k^{(1)}(l)$ and $h_k^{(2)}(l)$ referred to coded bits $d_k^{(1)}(l)$ and $d_k^{(2)}(l)$ and feeds them back to the MSD through the interleaver $\Pi_k$. Finally, the MSD uses these improved probabilities to update its joint probability distribution $P(d(l)|r(l))$.

The most popular multi-stream receiver algorithms perform iterative detection and decoding in a parallel or successive (serial) fashion. It is recognised that successive approaches perform better than the parallel. The Iterative Detection and Decoding (IDD) algorithm used in TCMA is described in the flowchart of in FIG. 5, where $r=(r(1), \ldots, r(L))$ indicates the received signal, $N_{it}$ indicates the number of iterations and K is the number of streams.

Using the iterative IDD algorithm at the receiver, the aggregate spectral efficiency of TCMA has been estimated (see FIG. 6, where the capacity of the Additive White Gaussian Noise (AWGN) channel is given as a reference). We observe that, although the two-stream SE exhibits very low SNR loss with respect to the single-stream SE, adding further streams results in an increased single-stream SNR loss. Moreover, the SNR gap with respect to the AWGN channel capacity increases with the number of streams: using K=7 streams, such gap approaches 12 dB.

SUMMARY OF

An objective of the present patent application is to provide a solution which mitigates or solves the drawbacks and problems of prior art solutions.

Another objective of the present patent application is to provide improved transmission and receiving TCM methods compared to prior art. Especially improved aggregate spectral efficiency in the transmission on the AWGN channel is sought.

According to a first aspect of the patent application, the above mentioned and other objectives are achieved by a transmission method in a wireless communication system, the method comprising the steps of:
selecting K number of data streams for transmission, wherein each data stream comprises one or more data messages; and independently for each data stream k=0, ..., K−1:
encoding and modulating data messages of the kth data stream using a Trellis Coded Modulation, TCM, scheme $TCM_k$,
interleaving the encoded and modulated data messages of the k-th data stream by using a stream specific interleaver $\Pi_k$,
scrambling the interleaved data messages of the k-th data stream by using a stream specific scrambling sequence;
combining all scrambled data messages of the K number of data streams into at least one transmission signal s(l); and
transmitting the at least one transmission signal s(l) over a radio channel of the wireless communication system.

According to an embodiment of the transmission method, the K number of data streams is selected from a set of Z>K data streams based on the channel quality of said radio channel, such as signal-to-noise ratio. According to this embodiment the K number of data streams experience substantially the same channel quality.

According to another embodiment of the transmission method, the encoder parameters and/or the modulation scheme of the $TCM_k$ is dependent on the number of selected streams K. According to this embodiment, wherein the $TCM_k$ encoder has four states for K≤3 and two states for K≥4. The modulation scheme may be any in the group comprising: PSK, QAM, PAM, ASK and APSK.

According to yet another embodiment of the transmission method, the interleavers $\Pi_k$ use any of: a set of randomly generated permutations; a set of permutations generated from circular shifts of a single randomly generated permutation; or a set of permutations generated according to the rule of quadratic polynomial permutation.

According to yet another embodiment of the transmission method, the coefficients of the scrambling sequence are dependent on the number of selected streams K. According to this embodiment, the coefficients of the scrambling sequence may be for: K=2, maximize the minimum Euclidean distance of the symbols of the signal constellation subject to symbol power constraint; K∈{3,4,5}, are uniformly phase spaced in [0, $\frac{\pi}{\mu}$)

where μ is a constant dependent on the modulation scheme; and K≥6, are the coefficients of a complex pseudo-random sequence, such as a Zadoff-Chu sequence. Yet further according to this embodiment μ may be equal to one for BPSK, PAM, and ASK; two for QPSK and QAM; four for 8 PSK; and eight for 16 PSK.

According to yet another embodiment of the transmission method, the number of selected streams is K≥2.

According to yet another embodiment of the transmission method, the combining is achieved by summing all the scrambled data messages of the K number of data streams to form the at least one transmission signal s(l).

According to yet another embodiment of the transmission method, the at least one transmission signal s(l) is transmitted by a single transmission device.

According to yet another embodiment of the transmission method, the at least one transmission signal s(l) is transmitted by a plurality of independent transmission devices.

According to yet another embodiment of the transmission method, each data message comprises a finite length sequence of information symbols or a block of information symbols.

According to yet another embodiment of the transmission method, the wireless communication system is an OFDM system or a single carrier system.

According to yet another embodiment of the transmission method, the K number of data streams uses the same TCM encoder parameters and/or modulation schemes.

According to a second aspect of the patent application, the above mentioned and other objectives are achieved by a first receiving method in a wireless communication system, the method comprising the steps of:
receiving the at least one transmission signal according to a transmission method according to the present patent application;
computing a joint probability for the modulation symbols of all K streams conditioned to the received signal r(l); and for each data stream k=0, ..., K−1:
a) computing soft information related to the modulation symbols for the kth data stream from the joint probability,
b) feeding the soft information related to the modulation symbols through a stream specific deinterleaver $\Pi_k^{-1}$ to a $TCM_k$ decoder for the k-th data stream,
c) decoding the deinterleaved soft information so as to obtain soft information related to information symbols of data messages for the k-th data stream and updated soft information related to the modulation symbols for the k-th data stream,
d) feeding the updated soft information related to the modulation symbols for the k-th data stream through a stream specific interleaver $\Pi_k$, and
e) updating the joint probability with the updated soft information related to the modulation symbols for the k-th data stream;
repeating steps a)-e) an arbitrary number of iterations for all K streams, and in the final iteration:
using the soft information related to information symbols for the k-th data stream so as to obtain decoded data messages for the k-th data stream, and
outputting the decoded messages for the k-th data stream.

According to an embodiment of the first receiving method, the joint probability P(s(l)|r(l)) is expressed as $P(s(l)|r(l))=P(s_0(l)=m_{j_0}, \ldots, s_{K-1}(l)=m_{j_{K-1}}|r(l))$ where $s_k(l)$ is l the modulation symbol transmitted by stream k in symbol interval l and $m_{j_k}$ is the $j_k$-th modulation symbol of the TCM constellation used on the k-th data stream. According to this embodiment the joint probability $P(s(l)|r(l))$ may be computed for a limited number of signal points $s(l)$ within a distance $R_0$ from the received signal $r(l)$. Yet further according to this embodiment the distance $R_0$ may be dependent on the channel quality, such as the signal-to-noise ratio. And the distance $R_0$ may increase with decreasing channel quality and decrease with increasing channel quality. According to this embodiment, the distance $R_0$ may further also be dependent on the amplitude of the received signal $r(l)$. According to this embodiment the distance $R_0$ may increase with increasing amplitude of the received signal $r(l)$ and decrease with decreasing amplitude of the received signal $r(l)$. Yet further according to this embodiment the distance $R_0$ may be computed as $R_0 = \alpha \sigma e^{|r(l)|^2/(2\beta K)}$ where $\alpha$ is a scaling parameter applied to the standard deviation of the noise and $\beta$ is a scaling parameter applied to the received signal amplitude $|r(l)|$, and $\sigma$ is the standard deviation of the noise.

According to yet another embodiment of the first receiving method, the joint probability may be only computed for a limited and fixed number of signal points closest to the received symbol $r(l)$ with respect to the Euclidean distance.

According to yet another embodiment of the first receiving method, the soft information related to the modulation symbols for the k-th data stream may be expressed as $p_{k,j}(l) = P(s_k(l) = m_{j_k}|r(l))$ where $P(s_k(l) = m_{j_k}|r(l))$ is the probability that the modulation symbol $s_k(l)$ transmitted on stream k in symbol interval l equals the $j_k$-th symbol $m_{j_k}$ of the $TCM_k$ symbol constellation conditioned to the value of the received signal $r(l)$.

According to yet another embodiment of the first receiving method, the joint probability and/or the soft information related to the modulation symbols are expressed in any of: probability values, logarithms of probability values, likelihood ratios, or logarithms of likelihood ratios.

According to yet another embodiment of the first receiving method, the joint probability may be computed by means of a multi stream detector.

According to yet another embodiment of the first receiving method, the processing for each data stream $k = 0, \ldots, K-1$ may be performed sequentially.

According to yet another embodiment of the first receiving method, the number of iterations is predetermined or related to the absence of transmission error.

According to a third aspect of the patent application, the above mentioned and other objectives are also achieved by a second receiving method in a wireless communication system, the method comprising the steps of:
receiving a communication signal $r(l)$, wherein the communication signal $r(l)$ has been encoded and modulated according to a Trellis Coded Multiple Access, TCMA, scheme and comprises K number of data streams indexed $k = 0, \ldots, K-1$, respectively, before transmission;
computing a joint probability for the modulation symbols of all K streams conditioned to the received signal $r(l)$; and for each data stream $k = 0, \ldots, K-1$:
a) computing soft information related to the modulation symbols for the kth data stream from the joint probability,
b) feeding the soft information related to the modulation symbols through a stream specific deinterleaver $\Pi_k^{-1}$ to a $TCM_k$ decoder for the k-th data stream,
c) decoding the deinterleaved soft information so as to obtain soft information related to information symbols of data messages for the k-th data stream and updated soft information related to the modulation symbols for the k-th data stream,
d) feeding the updated soft information related to the modulation symbols for the k-th data stream through a stream specific interleaver $\Pi_k$, and
e) updating the joint probability with the updated soft information related to the modulation symbols for the k-th data stream;
repeating steps a)-e) an arbitrary number of iterations for all K streams, and in the final iteration:
using the soft information related to information symbols for the k-th data stream so as to obtain decoded data messages for the k-th data stream, and
outputting the decoded messages for the k-th data stream.

It should be realised that all embodiments of the first receiving method also apply to the second receiving method of the present patent application. Therefore, all features of the mentioned embodiments can be used with the second receiving method.

Hence, according to an embodiment of the second receiving method, the joint probability $P(s(l)|r(l))$ is expressed as $P(s(l)|r(l)) = P(s_0(l) = m_{j_0}, \ldots, s_{K-1}(l) = m_{j_{K-1}}|r(l))$ where $s_k(l)$ is l the modulation symbol transmitted by stream k in symbol interval l and $m_{j_k}$ is the $j_k$-th modulation symbol of the TCM constellation used on the k-th data stream. According to this embodiment the joint probability $P(s(l)|r(l))$ may be computed for a limited number of signal points $s(l)$ within a distance $R_0$ from the received signal $r(l)$. Yet further according to this embodiment the distance $R_0$ may be dependent on the channel quality, such as the signal-to-noise ratio. And the distance $R_0$ may increase with decreasing channel quality and decrease with increasing channel quality. According to this embodiment, the distance $R_0$ may further also be dependent on the amplitude of the received signal $r(l)$. According to this embodiment the distance $R_0$ may increase with increasing amplitude of the received signal $r(l)$ and decrease with decreasing amplitude of the received signal $r(l)$. Yet further according to this embodiment the distance $R_0$ may be computed as $R_0 = \alpha \sigma e^{|r(l)|^2/(2\beta K)}$ where $\alpha$ is a scaling parameter applied to the standard deviation of the noise and $\beta$ is a scaling parameter applied to the received signal amplitude $|r(l)|$, and $\sigma$ is the standard deviation of the noise.

According to yet another embodiment of the second receiving method, the joint probability may be only computed for a limited and fixed number of signal points closest to the received symbol $r(l)$ with respect to the Euclidean distance.

According to yet another embodiment of the second receiving method, the soft information related to the modulation symbols for the k-th data stream may be expressed as $p_{k,j}(l) = P(s_k(l) = m_{j_k}|r(l))$ where $P(s_k(l) = m_{j_k}|r(l))$ is the probability that the modulation symbol $s_k(l)$ transmitted on stream k in symbol interval l equals the $j_k$-th symbol $m_{j_k}$ of the $TCM_k$ symbol constellation conditioned to the value of the received signal $r(l)$.

According to yet another embodiment of the second receiving method, the joint probability and/or the soft information related to the modulation symbols are expressed in any of: probability values, logarithms of probability values, likelihood ratios, or logarithms of likelihood ratios.

According to yet another embodiment of the second receiving method, the joint probability may be computed by means of a multi stream detector.

According to yet another embodiment of the second receiving method, the processing for each data stream k=0, ..., K−1 may be performed sequentially.

According to yet another embodiment of the second receiving method, the number of iterations is predetermined or related to the absence of transmission error.

According to a fourth aspect of the patent application, the above mentioned and other objectives are achieved with a transmission device arranged for processing and transmitting communication signals in a wireless communication system, the device comprising at least one processor being arranged to:
  select K number of data streams for transmission, wherein each data stream comprises one or more data messages; and independently for each data stream k=0, ..., K−1:
    encode and modulate data messages of the kth data stream using a stream specific Trellis Coded Modulation, TCM, scheme $TCM_k$,
    interleave the encoded and modulated data messages of the k-th data stream by using a stream specific interleaver $\Pi_k$,
    scramble the interleaved data messages of the k-th data stream by using a stream specific scrambling sequence;
  combine all scrambled data messages of the K number of data streams into at least one transmission signal s(l); and
  transmit the at least one transmission signal s(l) over a radio channel of the wireless communication system.

According to a fifth aspect of the patent application, the above mentioned and other objectives are achieved with a first receiving device arranged for receiving and processing communication signals in a wireless communication system, the device comprising at least one processor being arranged to:
  receive the at least one transmission signal transmitted by a transmission device according to the present patent application;
  compute a joint probability for the modulation symbols of all K streams conditioned to the received signal r(l); and for each data stream k=0, ..., K−1:
    a) compute soft information related to the modulation symbols for the k-th data stream from the joint probability,
    b) feed the soft information related to the modulation symbols through a stream specific deinterleaver $\Pi_k^{-1}$ to a $TCM_k$ decoder for the k-th data stream,
    c) decode the deinterleaved soft information so as to obtain soft information related to information symbols of data messages for the k-th data stream and updated soft information related to the modulation symbols for the k-th data stream,
    d) feed the updated soft information related to the modulation symbols for the k-th data stream through a stream specific interleaver $\Pi_k$, and
    e) update the joint probability with the updated soft information related to the modulation symbols for the k-th data stream;
  repeating steps a)-e) an arbitrary number of iterations for all K streams, and in the final iteration:
    use the soft information related to information symbols for the k-th data stream so as to obtain decoded data messages for the k-th data stream, and
    output the decoded messages for the k-th data stream.

According to a sixth aspect of the patent application, the above mentioned and other objectives are achieved with a second receiving device arranged for receiving and processing communication signals in a wireless communication system, the device comprising at least one processor being arranged to:
  receive a communication signal r(l), wherein the communication signal r(l) has been encoded and modulated according to a Trellis Coded Multiple Access, TCMA, scheme and comprises K number of data streams indexed k=0, ..., K−1, respectively, before transmission;
  compute a joint probability for the modulation symbols of all K streams conditioned to the received signal r(l); and for each data stream k=0, ..., K−1:
    a) compute soft information related to the modulation symbols for the k-th data stream from the joint probability,
    b) feed the soft information related to the modulation symbols through a stream specific deinterleaver $\Pi_k^{-1}$ to a $TCM_k$ decoder for the k-th data stream,
    c) decode the deinterleaved soft information so as to obtain soft information related to information symbols of data messages for the k-th data stream and updated soft information related to the modulation symbols for the k-th data stream,
    d) feed the updated soft information related to the modulation symbols for the k-th data stream through a stream specific interleaver $\Pi_k$, and
    e) update the joint probability with the updated soft information related to the modulation symbols for the k-th data stream;
  repeating steps a)-e) an arbitrary number of iterations for all K streams, and in the final iteration:
    use the soft information related to information symbols for the k-th data stream so as to obtain decoded data messages for the k-th data stream, and
    output the decoded messages for the k-th data stream.

The devices of the present patent application can all be modified, mutatis mutandis, according to the different embodiments of the corresponding transmission and receiving methods according to the present patent application.

The present patent application provides a solution which significantly reduces the gap with respect to the AWGN channel capacity resulting in an OMA system with very high aggregate SE. The SNR loss with respect to the single-user SE is also very limited with the present solution.

Further, the proposed scheme exhibits a high flexibility, in that the number of multiplexed streams can vary in a wide range. Moreover, the present patent application is applicable to both the downlink and uplink of wireless communication systems providing simultaneous transmission of multiple data streams. The proposed transmitter scheme can also be used with the prior art receiver, although with a higher SNR loss.

Further applications and advantages of the patent application will be apparent from the following detailed description.

BRIEF DESCRIPTION OF THE DRAWINGS

The appended drawings are intended to clarify and explain different embodiments of the present patent application in which.

DETAILED DESCRIPTION

The present patent application relates to a method for the concurrent transmission of multiple independent data streams, possibly intended for different users, by efficiently sharing the same physical time-frequency-space radio resources, such as Resource Elements (REs). The present patent application also relates to corresponding receiving methods.

Figure 7:
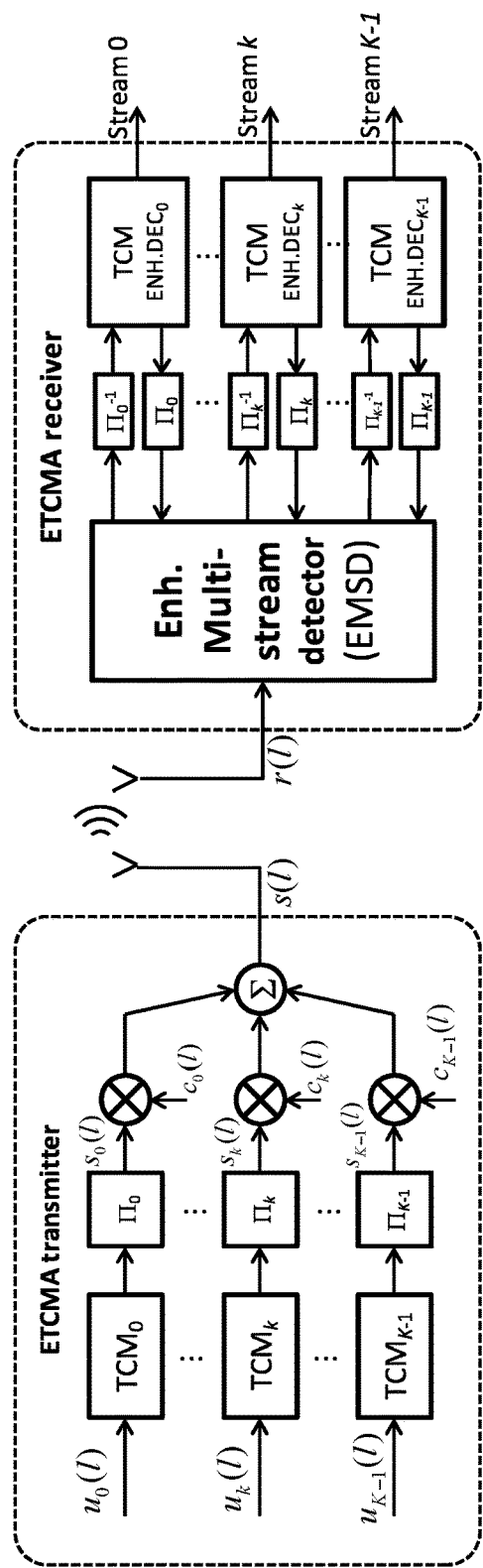
FIG. 7 illustrates and overview of a general transmission and receiving scheme according to the present patent application.

The present patent application applies both to the downlink and to the uplink of cellular wireless communication systems, operating either in the FDD mode or in the TDD mode. However, the patent application is not limited to cellular systems and can be applied in any suitable wireless communication system, such as general OFDM and single carrier systems. A general scheme of present system is illustrated in FIG. 7 in which a transmit device (left) of the present patent application transmits communication signal s(l) to a receiver device (right) of the present patent application which receives signal r(l) over the radio channel of a wireless communication system.

Transmission of data/information according to the present patent application comprises the following steps:

selecting K number of data streams for transmission, wherein each data stream comprises one or more data messages; and independently for each data stream $k=0, \ldots, K-1$:

encoding and modulating data messages of the kth data stream using a Trellis Coded Modulation, TCM, scheme $TCM_k$, interleaving the encoded and modulated data messages of the k-th data stream by using a stream specific interleaver $\Pi_k$, scrambling the interleaved data messages of the k-th data stream by using a stream specific scrambling sequence;

combining all scrambled data messages of the K number of data streams into at least one transmission signal s(l); and transmitting the at least one transmission signal s(l) over a radio channel of the wireless communication system.

According to an embodiment of the patent application, the data streams are selected for transmission according to the channel quality, such as signal-to-noise ratio (SNR), signal-to-interference plus noise ratio (SINR), or any other channel quality indicator. Accordingly, data streams with similar SNR or SINR values are grouped together and transmitted concurrently on the same REs. In the wireless communication system, there are Z data streams that must be transmitted to users. So, the K number of data streams is selected from a large set of Z>K data streams based on the channel quality of the radio channel. By this selection the data streams can be chosen such that the different data streams experience substantially the same channel quality, i.e., similar channel quality. This is particularly important when all TCM schemes are configured according to the same parameters, i.e., same convolutional encoder and same modulation scheme. In such case. similar error protection levels can be provided to all streams only if the experienced channel quality is similar. The number of data streams K should be two or more.

Furthermore, one message for each data stream is processed using a stream specific processing scheme. Each TCM encoder-modulator pair may consist of different trellis codes or modulation schemes. However, for simplification it is assumed that all data streams use the same TCM in the following description. Regarding the data messages of the streams, it is assumed according to an embodiment of the patent application that each data message comprises a finite length sequence of information symbols or a block of information symbols which is well understood.

According to another embodiment of the patent application the TCM encoder and modulation parameters are chosen according to Table 3 which implies that the encoder parameters and/or the modulation scheme of the $TCM_k$ for the different data streams are all equal but is dependent on the total number of selected data streams K according to the more general embodiment. Hence, according to an embodiment of the patent application the different data streams use the same encoders-modulators, i.e., TCM having the same encoding parameters and modulation schemes.

Figure 1:
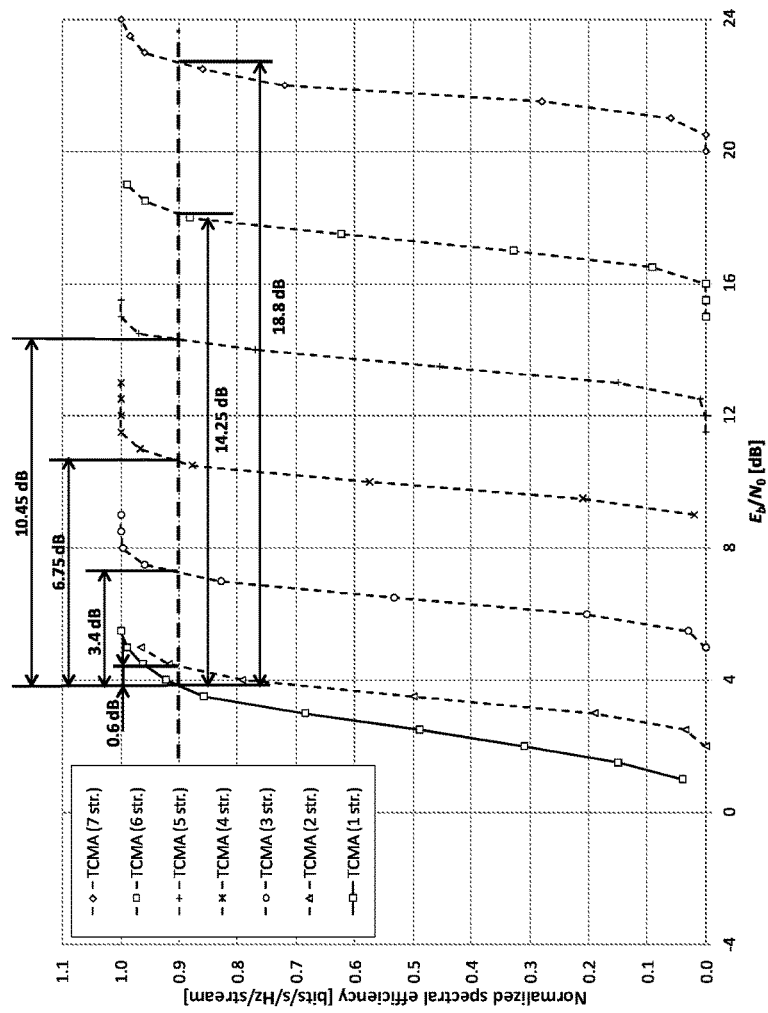
FIG. 1 shows the normalized spectral efficiency of the TCMA scheme.
Figure 2:
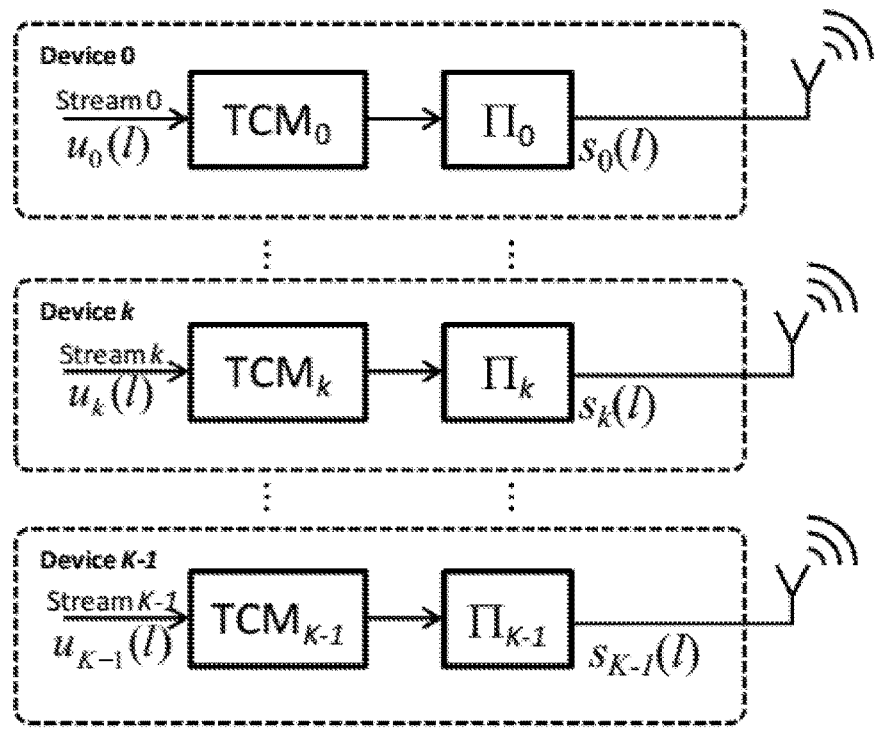
FIG. 2 illustrates a set of TCM transmitters according to prior art.
Figure 3:
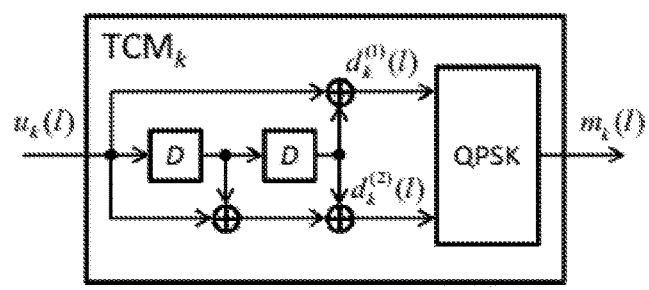
FIG. 3 illustrates a TCM encoder-modulator having a 4 state encoder and QPSK modulation.
Figure 4:
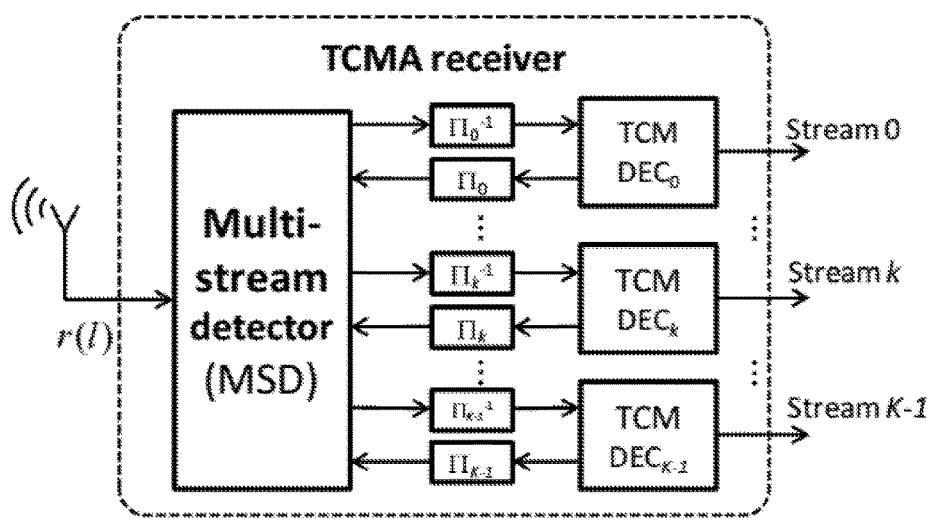
FIG. 4 illustrates a TCMA receiver according to prior art.
Figure 5:
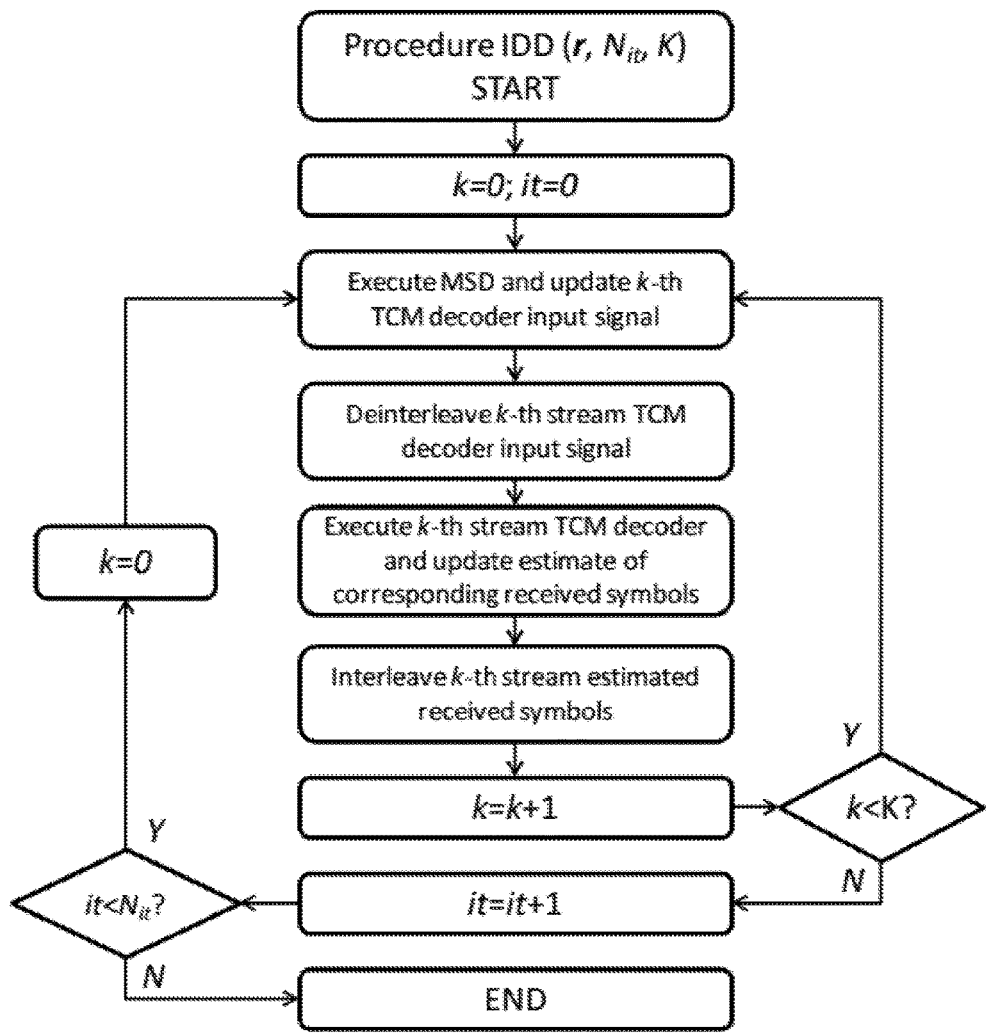
FIG. 5 shows a flow chart illustrating a prior art iterative detection and decoding method.
Figure 6:
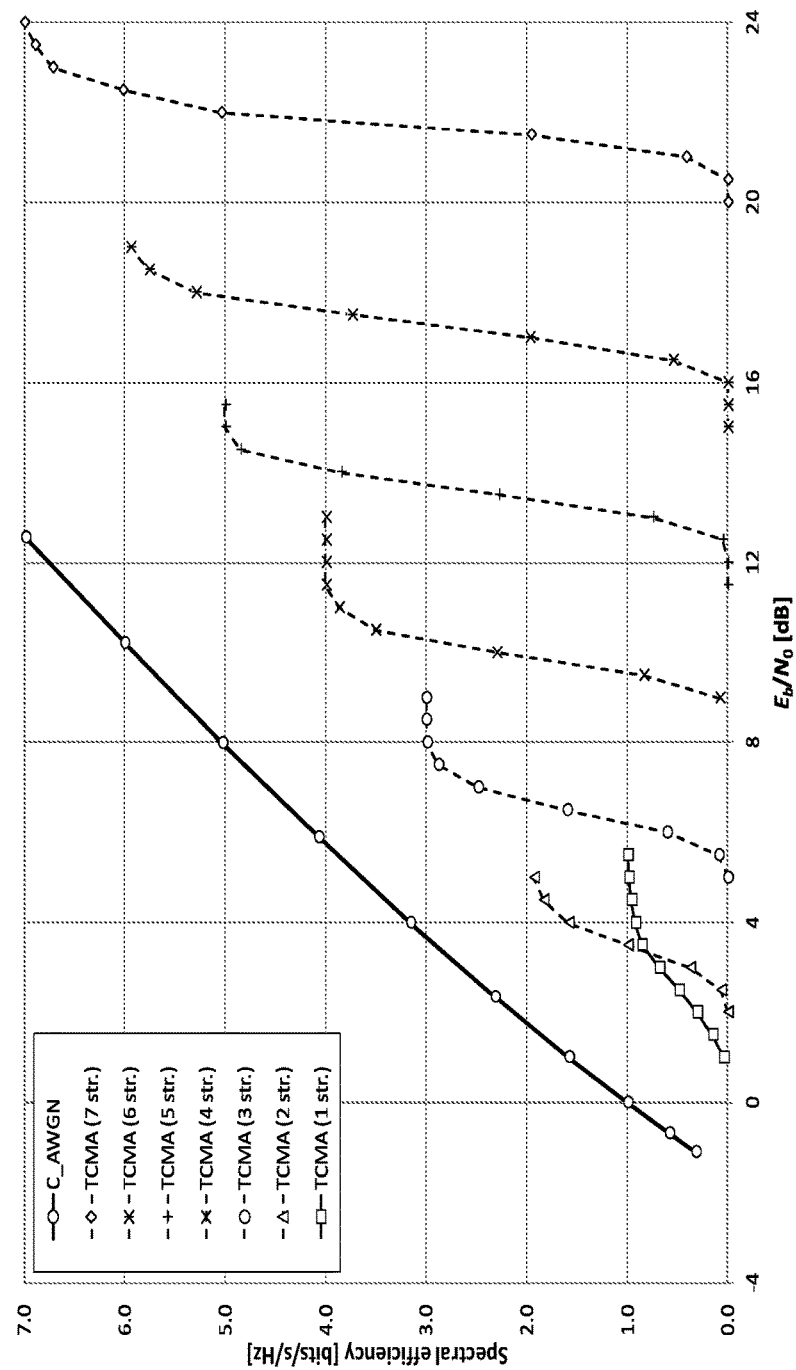
FIG. 6 shows aggregate spectral efficiency of TCMA with 1 to 7 number of streams.
Figure 8:
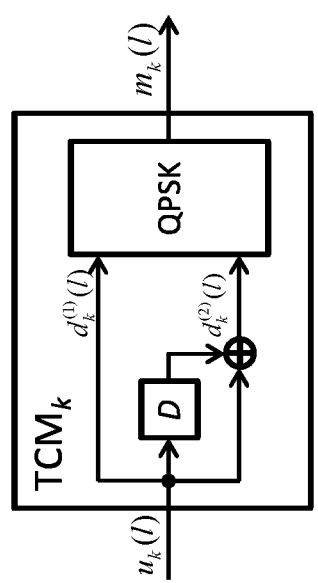
FIG. 8 illustrates a TCM encoder-modulator having 2 encoding states and a QPSK modulator.

When the number of streams is three or less, a TCM scheme with four-state convolutional encoders (as shown in FIG. 3) is used. When more than three streams are transmitted, a TCM scheme with two-state convolutional encoders (shown in FIG. 8) is used in the TCM scheme. The modulation scheme is QPSK in all cases but can be any other suitable modulation scheme. It has been realised by the inventors that at least the modulation schemes in the group comprising: PSK, QAM, PAM, ASK and APSK works well, but the skilled person realises that other modulation schemes can be used together with the present patent application.

TABLE 3

Choice of the TCM parameters as a function of the number of streams K

| Number of streams K | Type of convolutional encoder | Modulation |
|---|---|---|
| K ≤ 3 | Four-state encoders | QPSK |
| K ≥ 4 | Two-state encoders | QPSK |

Moreover, the interleavers $\Pi_k$ used in the present transmission method have to be stream specific in order to aid the present (iterative) receiver to separate the stream signals in the received radio communication signal. Indeed, interleavers can be considered as the signatures of the different data streams so stream specific means that it is unique for each data stream. The receiver is thus facilitated in recognizing and separating the stream information when the interleavers are different for the different data streams. Instead, when the data streams use equal interleavers, the system performance is significantly degraded.

With reference to FIG. 7, the TCM decoder of the k-th stream computes soft information to be fed back to the MSD through the stream specific interleaver $\Pi_k$. This soft information, after being processed by the MSD, is fed back to the next (i.e., the (k+1)-th) TCM decoder through the inverse stream specific interleaver $\Pi_{k+1}^{-1}$. The resulting permutation applied to such soft information corresponds to the equivalent permutation $\Pi_{k,k+1}^{(EQ)} = \Pi_{k+1}^{-1} \Pi_k$, i.e., the composition of the two permutations $\Pi_k$ and $\Pi_{k+1}^{-1}$.

The inventors have also realised that in order to avoid decreased performance, all interleavers $\Pi_{j,k}^{(EQ)}$ should avoid mapping sequences of consecutive input symbols into sequences of consecutive output symbols. This way, the correlation between the j-th TCM decoder and the k-th TCM decoder input is reduced, hence performance is improved.

Therefore, according to an embodiment a set of randomly generated permutations is used for interleaving. Experimental results show that randomly generated permutations perform well with respect to this characteristic, thus featuring good de-correlation properties.

According to another embodiment a set of permutations generated from circular shifts of a single randomly generated permutation is used for interleaving the data messages. The set of permutations $\{\Pi_k\}_{k=0}^{K-1}$ can be generated starting from a single permutation $\Pi_0$ and using circular shifts of the permutation for generating the whole set of K permutations. We define the input circular shift of a permutation as follows: given a permutation of size N defined as $\Pi: n \to \pi_n$, n=0, ..., N-1, its input circular shift of P positions is the permutation $\Pi^{(P,I)}: (n+P) \bmod N \to \pi_n$, n=0, ..., N-1. Similarly, the output circular shift of a permutation is defined as $\Pi^{(P,O)}: n \to (P+\pi_n) \bmod N$, n=0, ..., N-1. Starting from a randomly generated permutation $\Pi_0$, we define the set of stream-specific permutations as $\Pi_k = \Pi_0^{(kQ,I)}$ (or alternatively $\Pi_k = \Pi_0^{(kQ,O)}$) where Q is a suitably chosen integer. Any choice of Q larger than the constraint length of the constituent TCM encoder yields good results. This embodiment is convenient since only one permutation has to be stored in the memory of the transmitter and receiver, while all other stream-specific permutations can be easily generated starting from the only one permutation.

According to yet another embodiment of the patent application a set of permutations generated according to the Quadratic Polynomial Permutation (QPP) rule, also used in the 3GPP LTE standard, is used for interleaving. QPP interleavers are of particular interest since they exhibit the contention-free property, a nice characteristic that permits parallelized high-speed implementation of decoding algorithms.

QPP permutations are functions of three parameters, namely: the permutation size N and the two coefficients $f_1$, $f_2$ of the quadratic polynomial used to generate the permutation:

$$\pi_n = (f_1 n + f_2 n^2) \bmod N, n=0, \ldots, N-1. \quad (5)$$

For each size N, two sets of possible values for $f_1$ and for $f_2$ are defined. Values for $f_1$ and for $f_2$ can be independently chosen from the two sets. QPP interleavers for the present patent application have been generated choosing a fixed value for $f_2$ and different values for $f_1$ in order to obtain different permutations.

Furthermore, scrambling codes are used to further separate data streams in the signal domain so that the discrimination of the data streams is facilitated by using stream specific scrambling sequences. Each encoded, modulated and interleaved stream is scrambled and combined with the other streams before transmission according to the present patent application. This is a very important aspect of the present patent application.

The scrambling consists in multiplying the sequence of interleaved modulation symbols $s_k(l)$ with a stream-specific sequence of complex coefficients $c_k = (c_k(l))$, where index k=0, ..., K−1 refers to the stream, and index l=0, ..., L−1 refers to the symbol interval (L is the block length). The signal transmitted by the present system at symbol interval l is $$s(l) = \sum_{k=0}^{K-1} c_k(l) s_k(l) \quad (6)$$

and it belongs to the superposed-constellation x(l) which contains all possible values of s(l). This means that the combining of the different data streams is an addition of the different scrambled streams so as to form the transmission signal s(l) for transmission in the wireless communication system.

To optimize the SE of the present scheme through scrambling, different solutions are possible. According to an embodiment the coefficients $c_k = (c_k(l))$ are made independent of the time index l, therefore $c_k(l) = c_k$, l=0, ..., L−1. Moreover, the values of coefficients $c_k$ are chosen to maximize the minimum Euclidean distance between symbols of the superposed constellation, or super-constellation, for short. The minimum Euclidean distance of the super-constellation is defined as $$D_{E,min}(l) = \min_{i \neq j} D_E(x_i(l), x_j(l)) \quad (7)$$

where symbols $x_i(l)$, $x_j(l)$ are any distinct pair of symbols belonging to the super-constellation x(l). The scrambling sequences are optimized in order to achieve the maximum $D_{E,min}(l)$ for all l=0, ..., L−1.

Figure 9:
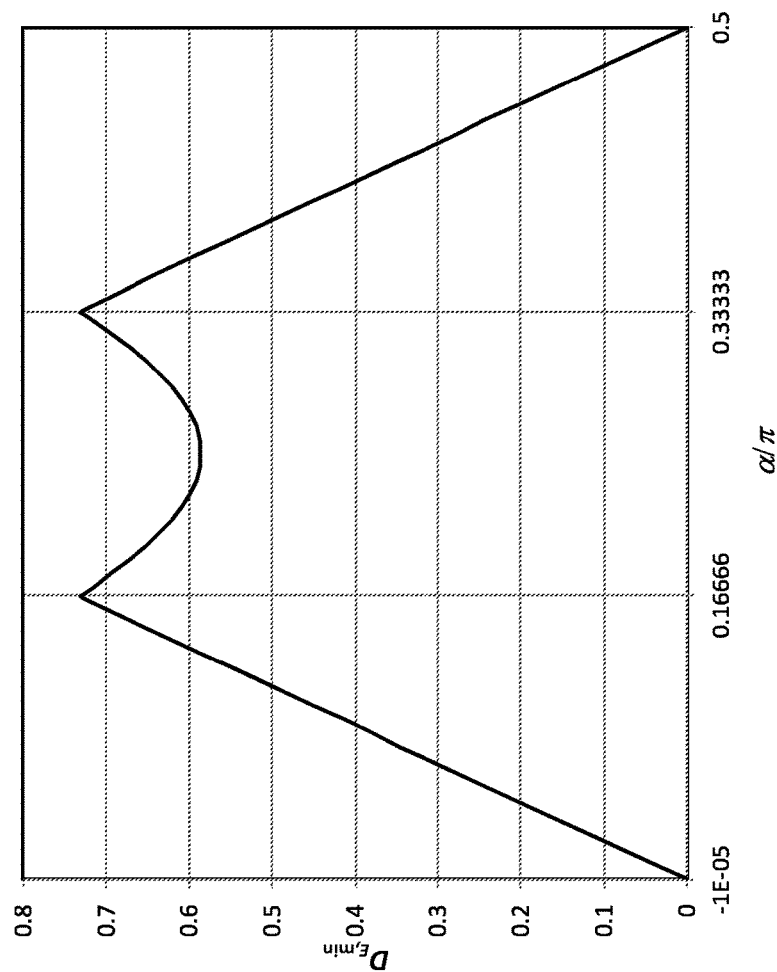
FIG. 9 illustrates the minimum Euclidean distance of a super-constellation according to the present patent application.

As an example, we consider the case of two streams using QPSK signal constellations. The first stream (k=0) is scrambled using the sequence $c_0(l)=1$ and the second stream (k=1) is scrambled using the sequence $c_1(l)=\exp(j\alpha)$. In FIG. 9 $D_{E.min}$ of the super-constellation is shown as a function of α. Two solutions maximize $D_{E.min}$:α=π/6 and α=π/3.

In general, for any number of streams K and for any TCM constellation, it is possible to find a set of optimal scrambling sequences $c_k^{opt}(l)$, k=0, . . . , K−1 that maximizes $D_{E.min}$ which means that the coefficients of the scrambling sequence are dependent on the number of selected streams K according to an embodiment of the patent application.

Accordingly, for K∈{3,4,5} it has been observed that the best performance is obtained choosing the phases as uniformly spaced in a given interval [0,π/μ), where μ is a constant dependent on the TCM constellation as $$c_k(l) = \exp\left(j\frac{\pi k}{\mu K}\right), k = 0, \ldots, K-1. \tag{8}$$

Therefore, according to an embodiment of the patent application μ=1 for BPSK, PAM, ASK, μ=2 for QPSK and QAM, μ=4 for 8 PSK, and μ=8 for 16 PSK. This solution does not result in a super-constellation with maximum $D_{E.min}$. However, simulations show that its performance is the best for K=3, 4, 5.

For the case K≥6, any suitable complex set of sequences with random-like properties can be used for scrambling. In particular, Zadoff-Chu (ZC) sequences, a class of complex sequences with low cross-correlation properties, are well suited in this respect. We have hence $$c_k(l) = \exp\left(-\frac{j\pi r_k l(l+1)}{L}\right), l = 0, \ldots, L-1 \tag{9}$$

where $r_k$ is a stream-specific value in this case.

The choice of the scrambling sequence type is made as a function of the number of streams K, as summarized in the embodiment of Table 4. These parameters are the result of a search performed through simulation. Better results could be obtained by further extending the search.

TABLE 4

Example of scrambling sequence as a function of the number of streams K

| Number of streams K | Scrambling sequence family |
| --- | --- |
| K = 2 | maximum $D_{E.min}$ |
| K = 3, . . . , 5 | Uniformly spaced in [0, π/μ) |
| K ≥ 6 | Zadoff-Chu |

The high performance of the present receivers is achieved thanks to the new iterative detection and decoding algorithm that operates on soft information related to modulation symbols $s_k(l)$ instead of soft information related to coded bits $d_k^{(i)}(l)$ as done in prior art. In this way, the loss of information incurred when converting symbol-wise soft information to bit-wise soft information is avoided. For simplicity, the scrambling sequences and the channel state information are assumed to be perfectly known at the receiver.

The present receiver method comprises the steps of:
receiving the at least one transmission signal transmitted by a method according to the present patent application;
computing a joint probability for the modulation symbols of all K streams conditioned to the received signal r(l); and for each data stream k=0, . . . , K−1:
a) computing soft information related to the modulation symbols for the kth data stream from the joint probability,
b) feeding the soft information related to the modulation symbols through a stream specific deinterleaver $\Pi_k^{-1}$ to a $TCM_k$ decoder for the k-th data stream,
c) decoding the deinterleaved soft information so as to obtain soft information related to information symbols of data messages for the k-th data stream and updated soft information related to the modulation symbols for the k-th data stream,
d) feeding the updated soft information related to the modulation symbols for the k-th data stream through a stream specific interleaver $\Pi_k$, and
e) updating the joint probability with the updated soft information related to the modulation symbols for the k-th data stream;
repeating steps a)-e) an arbitrary number of iterations for all K streams, and in the final iteration:
using the soft information related to information symbols for the k-th data stream so as to obtain decoded data messages for the k-th data stream, and
outputting the decoded messages for the k-th data stream.

With reference to FIG. 7, the TCM decoder of the k-th stream computes soft information to be fed back to the MSD through the stream specific interleaver $\Pi_k$. This soft information, after being processed by the MSD, is fed back to the next (i.e., the (k+1)-th) TCM decoder through the inverse stream specific interleaver $\Pi_{k+1}^{-1}$.

The Enhanced MSD (EMSD) of the present patent application performs the computation of the joint probability distribution $P(s(l)=x_i(l)|r(l))=P(s_0(l)=m_{j_0}, \ldots, s_{K-1}(l)=m_{j_{K-1}}|r(l))$ for all points $x_i(l)$ of the super-constellation x(l) obtained as $$x_i(l) = \sum_{k=0}^{K-1} c_k(l) m_{jk} \tag{10}$$

and iteratively updates the joint probability by iterating with the present Enhanced TCM (ETCM) decoders. For each stream k, the EMSD computes the soft information related to the modulation symbols for the k-th data stream $p_{k,j}(l)=P(s_k(l)=m_j|r(l))$ that the l-th modulation symbol of stream k equals the j-th symbol $m_j$ of the $TCM_k$ constellation. Then, the EMSD feeds these probabilities to the ETCM decoder through the deinterleaver $\Pi_k^{-1}$.

The ETCM decoder receives in input the probability distributions $p_{k,j}(l)$, executes a trellis-based decoding algorithm (e.g, Viterbi, BCJR or SISO) that applies the TCM code constraints and computes updated probabilities $q_{k,j}(l)$, which are fed back to the EMSD through the interleaver $\Pi_k$. The EMSD uses the updated probabilities $q_{k,j}(l)$ to update the joint probability distribution P(s(l)|r(l)) thus gaining improved knowledge of the transmitted symbol s(l). Then, the EMSD proceeds to processing the next data stream, and accordingly the processing for the different data streams is performed sequentially according to an embodiment of the patent application.

More in detail, the EMSD performs the following steps:

Receiving updated probabilities $q_{k,j}(l)$ of soft information related to modulation symbols from at least one of the ETCM decoders;

Re-computing the joint probability distribution of modulation symbol $P(s(l)=x_i(l)|r(l))$ taking into account the updated probabilities:

$$P(s(l) = x_i(l) \mid r(l)) = \prod_{k=0}^{K-1} \prod_{j: x_k = m_j} q_{k,j}(l), \quad (11)$$

$$l = 0, \ldots, L-1$$

For each data stream $k=0, \ldots, K-1$, re-computing the soft information related to the modulation symbols for the k-th data stream $p_{k,j}(l)$ to be provided to the k-th ETCM decoder at the next iteration:

$$p_{k,j}(l) = P(s_k = m_j \mid r(l)) \quad (12)$$
$$= \sum_{x: x_k = m_j} P(s(l) = x_i(l) \mid r(l)),$$

$$l = 0, \ldots, L-1$$

Feeding the probability distributions $p_{k,j}(l)$ to each ETCM decoder through their associated deinterleavers.

Moreover, the patent application also relates to a second aspect of the receiving method which comprises the steps of:

receiving a communication signal r(l), wherein the communication signal r(l) has been encoded and modulated according to a Trellis Coded Multiple Access, TCMA, scheme and comprises K number of data streams indexed $k=0, \ldots, K-1$, respectively, before transmission;

computing a joint probability for the modulation symbols of all K streams conditional to the received signal r(l); and for each data stream $k=0, \ldots, K-1$:

a) computing soft information related to the modulation symbols for the kth data stream from the joint probability, b) feeding the soft information related to the modulation symbols through a stream specific deinterleaver $\Pi_k^{-1}$ to a $TCM_k$ decoder for the k-th data stream, c) decoding the deinterleaved soft information so as to obtain soft information related to information symbols of data messages for the k-th data stream and updated soft information related to the modulation symbols for the k-th data stream, d) feeding the updated soft information related to the modulation symbols for the k-th data stream through a stream specific interleaver $\Pi_k$, and e) updating the joint probability with the updated soft information related to the modulation symbols for the k-th data stream;

repeating steps a)-e) an arbitrarily number of iterations for all K streams, and in the final iteration:

using the soft information related to information symbols for the k-th data stream so as to obtain decoded data messages for the k-th data stream, and outputting the decoded messages for the k-th data stream.

Hence, it is realised that the second aspect of the receiving method can be used with the general Trellis Coded Multiple Access, TCMA, schemes. In fact, the TCMA scheme of prior art can be regarded as a special case of ETCMA in which only one stream per transmitter/device is transmitted and no scrambling is applied.

Receiver Complexity Reduction

The EMSD computes and updates the probability distribution $P(s(l)=x_i(l)|r(l))$ over the whole super-constellation, i.e., for all $x_i(l) \in x(l)$. Since the size of x(l) grows exponentially with the number of streams K, the complexity of the receiver algorithm grows exponentially with K as well. Hence, the present receiver methods have a complexity which grows exponentially with the number of data streams K.

It has been noted that the present system, when a large number of streams are transmitted, requires high SNR. In such condition, the received signal r(l) is, with high probability, close to the transmitted symbol s(l). Hence, the inventors have realised that it is unnecessary for the EMSD to compute the probability distribution $P(s(l)=x_i(l)|r(l))$ over the whole super-constellation. Instead, the number of super-constellation points $x_i(l) \in x(l)$ over which the probability distribution is computed can be restricted to a smaller subset of symbols in the vicinity of the received symbol r(l). Therefore, the proposed approach for reducing the complexity of the ETCMA receiver consists in reducing the number of super-constellation points $x_i(l)$ of the probability distribution $P(s(l)=x_i(l)|r(l))$ computed by the EMSD to a region around the received signal r(l).

Figure 14:
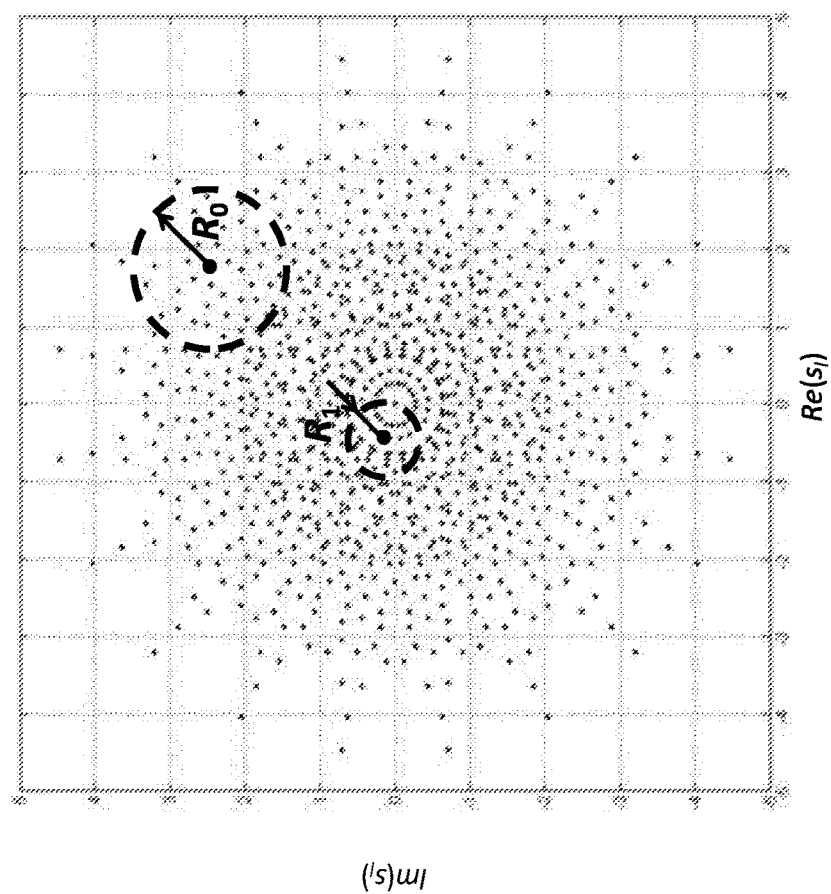
FIG. 14 shows the super-constellation of a five stream ETCMA system where each stream is modulated using QPSK modulation.

A first embodiment consists in defining the reduced set of super-constellation points $x_i(l)$ as consisting of the symbols $x_i(l)$ that fall within a distance $R_0(SNR)$ of the received symbol r(l). This concept is sketched in FIG. 14, where two possible received symbols are indicated by black dots and the circles with radius $R_0$ and $R_1$ delimit the number of super-constellation points $x_i(l)$ over which the MSD performs its computation hence the computational complexity is substantially reduced.

The radius $R_0$ is adaptively computed as a function of the channel quality (e.g., SNR or SINR) such that, for low SNR, it takes large values while, for high SNR, it takes small values. In other words the distance $R_0$ increases with decreasing channel quality and decreases with increasing channel quality. This is essential for minimizing the chance that the transmitted symbol (l) is not among the signals $x_i(l)$ included in the reduced signal set. In such case, the iterative algorithm would never be able to deliver the correct decoded message. It is realised that other measures than SNR or SINR can be used for representing the channel quality.

The first embodiment, although simple, leads to the following drawback: since the super-constellation does not feature a uniform density, the number of points in the reduced signal set is not constant. In particular, the super-constellation x(l) exhibits a high density close to its centre and a lower density far from the centre. A second embodiment, aimed at keeping almost constant the number of points in the reduced signal set, consists in setting the radius $R_0(SNR,|r(l)|)$ as a function of the channel quality and the amplitude of the received symbol |r(l)| so that when |r(l)| is small, $R_0$ is small, and when |r(l)| is large, $R_0$ is large ($R_1<R_0$ in FIG. 14). So, the distance $R_0$ is further dependent on the amplitude of the received signal r(l) such that the distance $R_0$ increases with increasing amplitude of the received signal r(l) and decreases with decreasing amplitude of the received signal r(l). Accordingly, for good performance the distance $R_0$ may be computed as $R_0 = \alpha_0 e^{|r(l)|^2/(2\beta K)}$, where $\alpha$ is a first scaling parameter applied to the standard deviation of the noise and β is a second scaling parameter applied to the received signal amplitude |r(l)|, and σ is the standard deviation of the noise. These mentioned embodiments compensate for the variable density of the super-constellation, although still results in a reduced signal set containing a variable number of points.

Another approach to reduce the receiver complexity is to limit the number of considered signal points, i.e., the joint probability is only computed for a limited and fixed number of signal points $D_0$ closest to the received symbol r(l) with respect to the Euclidean distance. This approach leads to similar results as the previous approaches while featuring the advantage of a constant number of points included in the reduced signal set. In practice, the super-constellation symbols are ordered based on their Euclidean distance from the received symbol r(l) and then the $D_0$ symbols with lowest Euclidean distance from r(l) are included in the restricted signal space.

It should further be realised by the skilled person that the joint probability and/or the soft information used in the present receivers related to the modulation symbols may be expressed in any of: probability distributions, logarithms of probability distributions, likelihood ratios, or logarithms of likelihood ratios.

Examples of Application Scenarios

Figure 10:
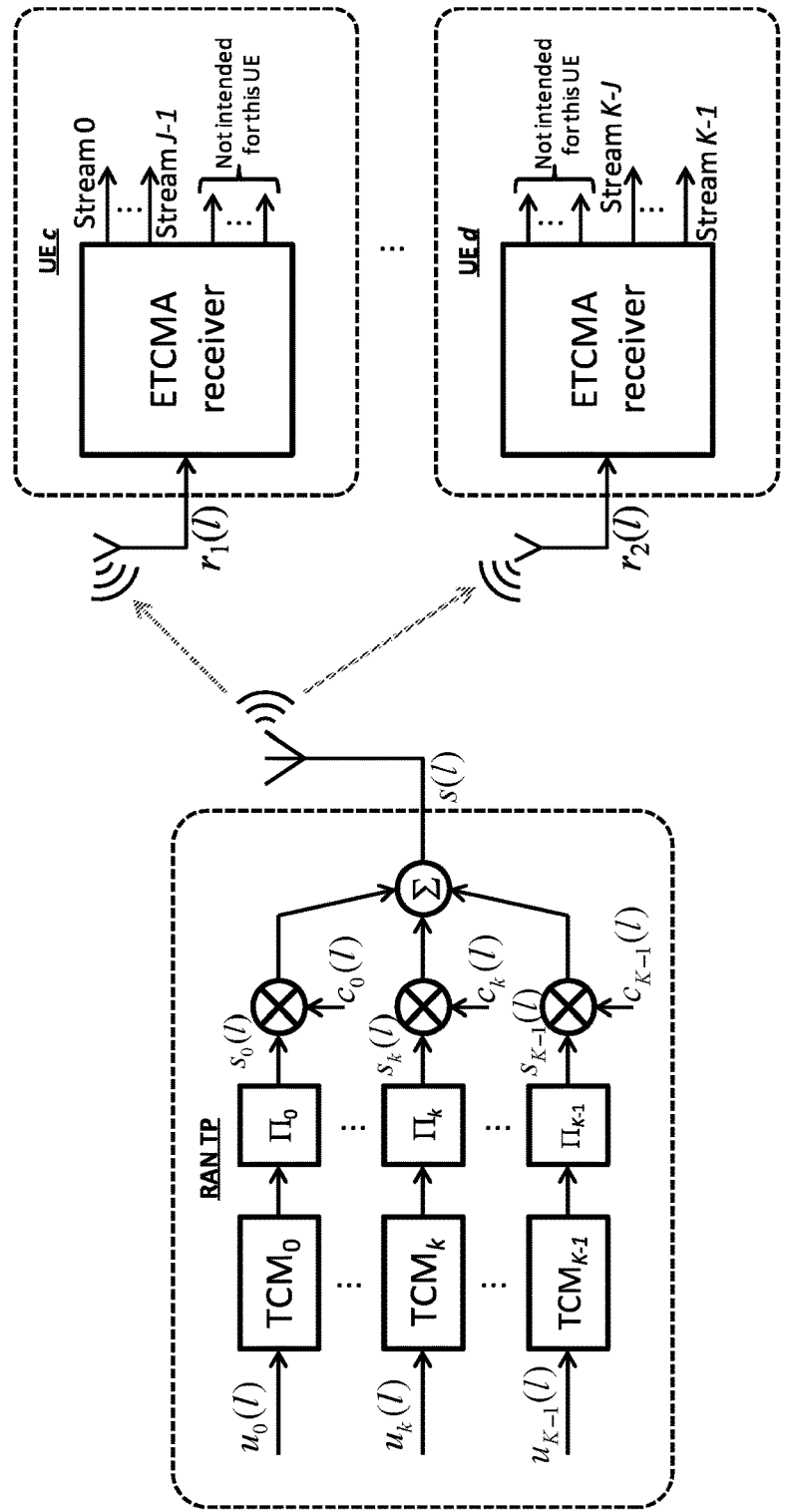
FIG. 10 illustrates an embodiment of the present patent application applied in the downlink.

A first possible application of the present transmission/receiving scheme concerns the Downlink (DL) of wireless communication systems, e.g. cellular systems such as 3GPP LTE and LTE Advanced. With reference to FIG. 10 a single transmitter device sends multiple (at least two) data streams to at least one receiver device. The complex coefficients $c_k(l)$ are chosen according to the aforementioned solutions. For example, a maximum $D_{E,min}$ solution for the case of two streams with QPSK constellations would be the following:

$$c_0(l) = \exp(j\varphi); \quad (13)$$
$$c_1(l) = \exp j\left(\varphi + \frac{\pi}{6}\right),$$
$$\forall l = 0, \ldots, L-1.$$

Such solution is optimal for any value of $\varphi \in \mathbb{R}$

For the case of $K \in \{3,4,5\}$ streams, we would choose $$c_k(l) = \exp j\left(\varphi + \frac{\pi k}{2K}\right), \quad (14)$$
$$k = 0, \ldots, K-1,$$
$$l = 0, \ldots, L-1.$$

Figure 11:
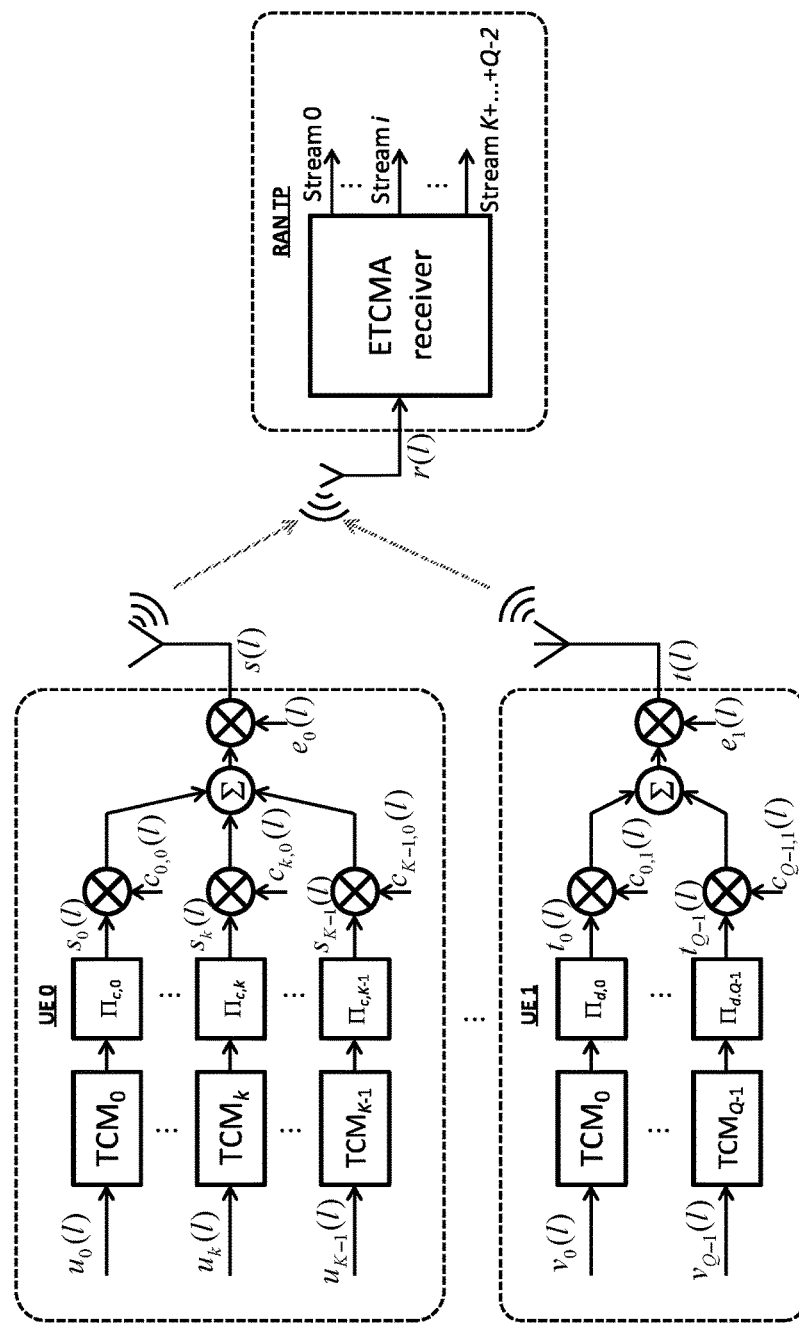
FIG. 11 illustrates an embodiment of the present patent application applied in the uplink.

A second possible application of the present transmission/receiving scheme concerns the Uplink (UL) of wireless communication systems, see FIG. 11. Here, multiple (at least one) devices transmit their modulated signals to a Radio Access Network (RAN) transmission point. All transmitted signals are thereafter combined at the receiver antenna as a result of the wireless channel linearity. Carrier signals from different devices are necessarily characterized by phase and frequency offsets, such that a phase control of the transmitted signals aimed at obtaining the desired combination at the receiver antenna is very complex to implement.

Concerning the UL case, two cases have to be considered: the first case concerns data streams transmitted by the same communication device (e.g., a UE). In this case, the same approach used for DL scrambling to set the phase differences between streams can be applied. The second case concerns data streams transmitted by different devices. In this case, a simple and effective solution consists in randomizing the phases of the streams according to different device-specific randomization sequences. Randomization is performed by associating to each device a different pseudo-random scrambling sequence. Again, ZC sequences or any other pseudo random sequences are proposed in this purpose.

The scrambling sequence used on the k-th data stream transmitted by the u-th device is $c_{k,u}(l)e_u(l)$, where $c_{k,u}(l)$ is a stream-specific scrambling sequence unique within the device and $e_u(l)$ is a device-specific scrambling sequence defined as $$e_u(l) = \exp j\left(\frac{\pi r_u l(l+1)}{L}\right), \quad (15)$$
$$l = 0, \ldots, L-1,$$
$$u = 0, \ldots, U-1.$$

Figure 12:
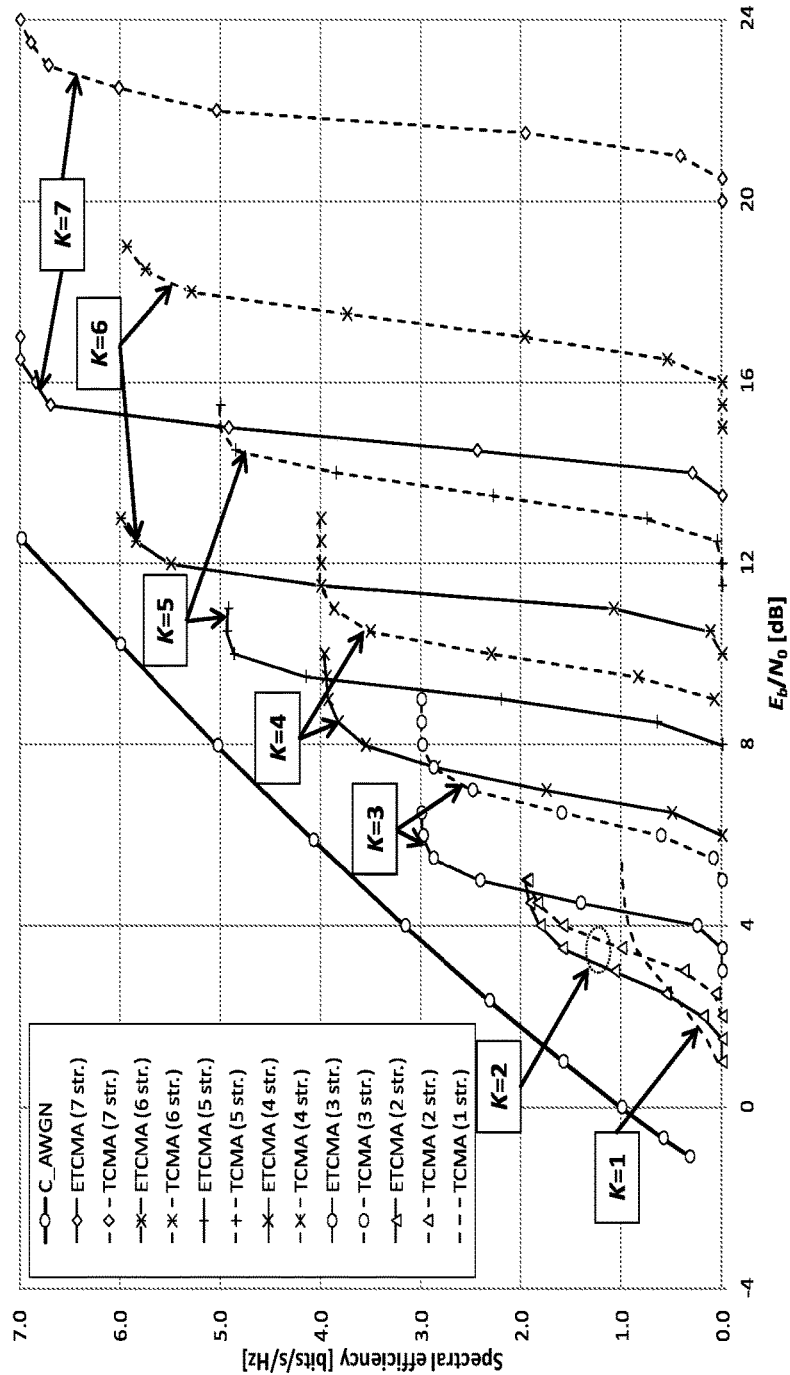
FIG. 12 shows aggregate SE performance for the present patent application compared to the SE of a prior art TCMA system.

FIG. 12 shows the achieved SE of the present scheme. The TCM encoders and modulators, interleavers and scrambling sequences are selected according to the solutions described in previous description. The observed improvement is significant: e.g., in the case of K=7 streams, the SNR gain is close to 8 dB which is very good.

Figure 13:
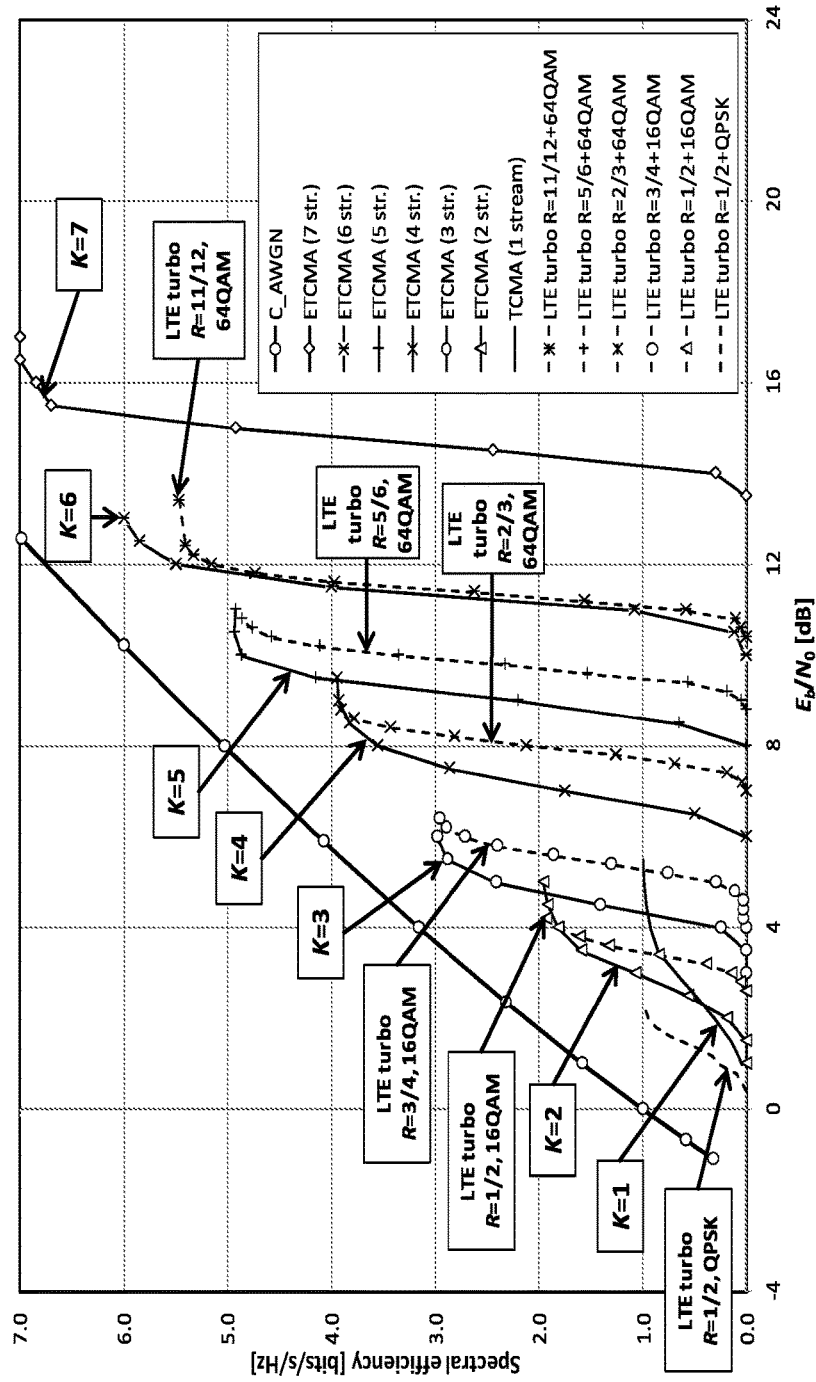
FIG. 13 shows aggregate SE performance for the present patent application compared to a turbo-coded LTE system.

FIG. 13 shows a comparison between the SE of the present scheme and the SE of an LTE turbo-coded system. It is observed that the present scheme performs better than the LTE system for almost all SNR and SE values. Moreover, it is shown that the present system is capable of achieving spectral efficiencies as high as 7 bits/s/Hz, which is impossible to achieve in the LTE system.

Moreover, as understood by the person skilled in the art, any method according to the present patent application may also be implemented in a computer program, having code means, which when run by processing means causes the processing means to execute the steps of the method. The computer program is included in a computer readable medium of a computer program product. The computer readable medium may comprises of essentially any memory, such as a ROM (Read-Only Memory), a PROM (Programmable Read-Only Memory), an EPROM (Erasable PROM), a Flash memory, an EEPROM (Electrically Erasable PROM), or a hard disk drive.

Furthermore, the present method in a transmitter and a receiver can be implemented and executed in suitable transmitter and receiver communication devices, respectively. It is realized by the skilled person that the present transmitter and receiver devices may comprise the necessary communication capabilities in the form of e.g., functions, means, units, elements, etc., for executing the methods according to the patent application which means that the devices can be modified, mutatis mutandis, according to any method of the present patent application. Examples of other such means, units, elements and functions are: memory, encoders, decoders, mapping units, multipliers, interleavers, deinterleavers, modulators, demodulators, inputs, outputs, antennas, amplifiers, DSPs, MSDs, TCM encoder, TCM decoder, etc. which are suitably arranged together. Examples of transmitter and receiver devices are base stations (such as eNB), mobile devices (such as UEs), relay devices, remote radio heads, hyper transmitters-receiver, virtual transmitters-receiver, coordinated multi-point transmitters-receiver, etc.

Especially, the processors of the present devices may comprise, e.g., one or more instances of a Central Processing Unit (CPU), a processing unit, a processing circuit, a processor, an Application Specific Integrated Circuit (ASIC), a microprocessor, or other processing logic that may interpret and execute instructions. The expression "processor" may thus represent a processing circuitry comprising a plurality of processing circuits, such as, e.g., any, some or all of the ones mentioned above. The processing circuitry may further perform data processing functions for inputting, outputting, and processing of data comprising data buffering and device control functions, such as call processing control, user interface control, or the like.

Figure 15:
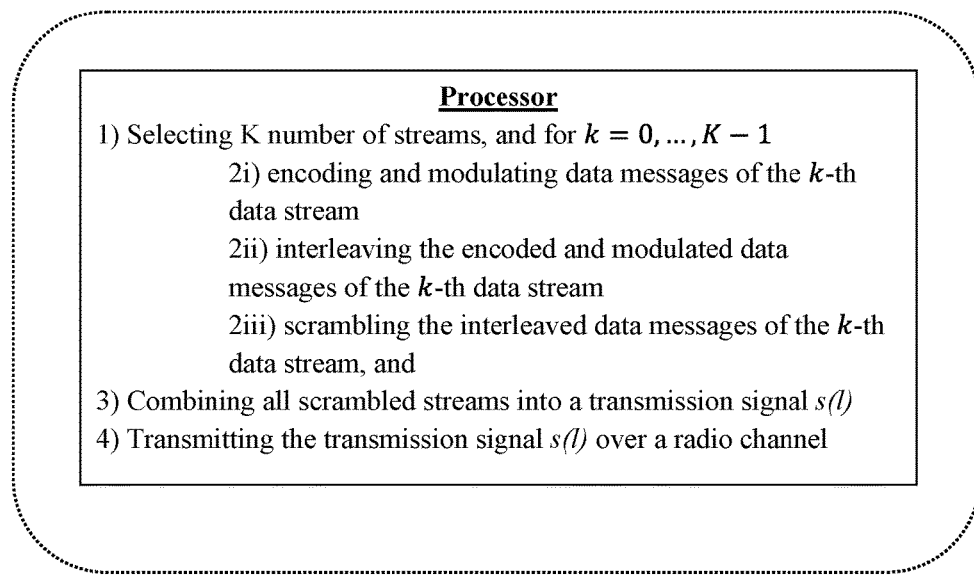
FIG. 15 illustrates a transmission device according to an embodiment of the present patent application.

The present transmitter devices comprise at least one processor which is arranged to execute the steps of the transmission method according to the present patent application. This embodiment is illustrated in FIG. 15 in which the transmitter device comprises a processor arranged for executing the different steps of the present method.

Figure 16:
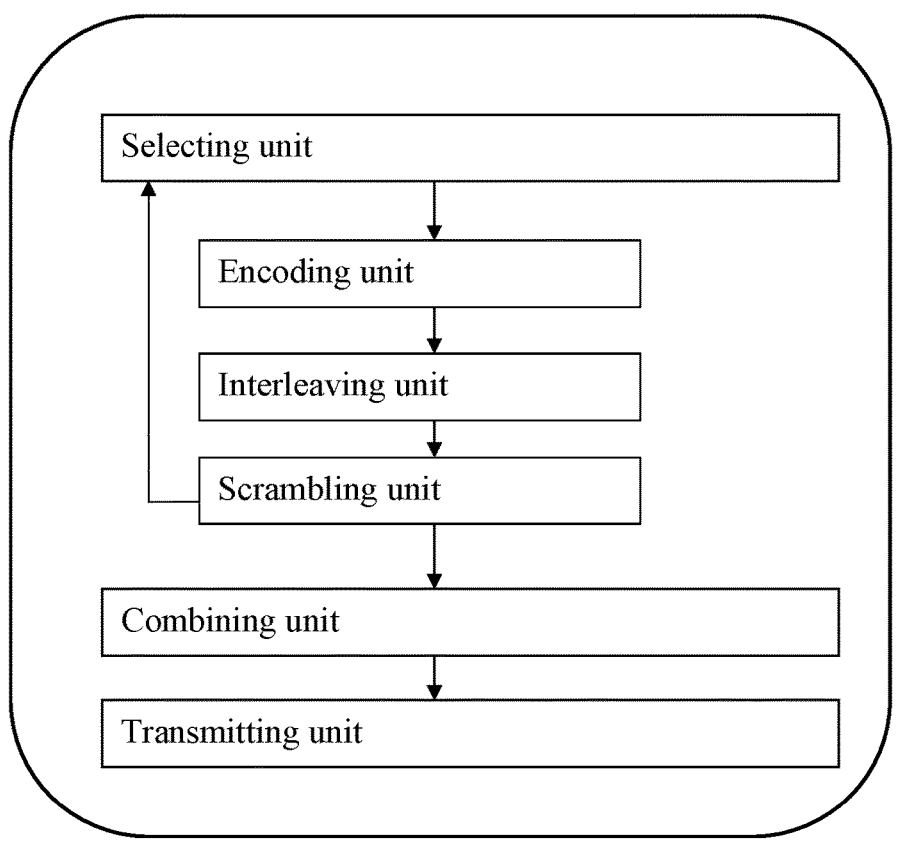
FIG. 16 illustrates an alternative transmission device according to an embodiment of the present patent application.

Alternatively, according to another embodiment of the patent application the present transmitter device comprises dedicated units for the performance of the method steps. This embodiment is illustrated in FIG. 16 in which the transmitter device comprises dedicated units, suitably connected to each other, for the corresponding method steps. The device according to this embodiment comprises a selecting unit, encoder units, interleaving units, scrambling units, a combining unit, and a transmitting unit.

Figure 17:
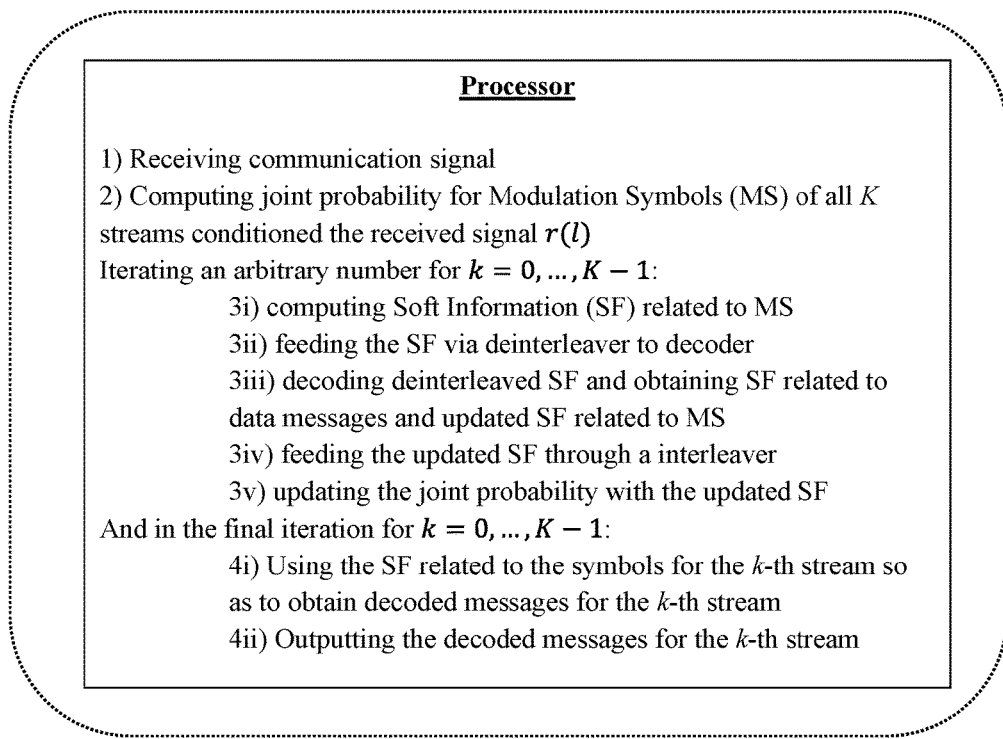
FIG. 17 illustrates a first or a second receiving device according to an embodiment of the present patent application.

The present receiver devices comprise a processor which is arranged to execute the steps of the receiver method according to the present patent application. This embodiment is illustrated in FIG. 17 in which the receiver device comprises a processor arranged for executing the different steps of the present method.

Figure 18:
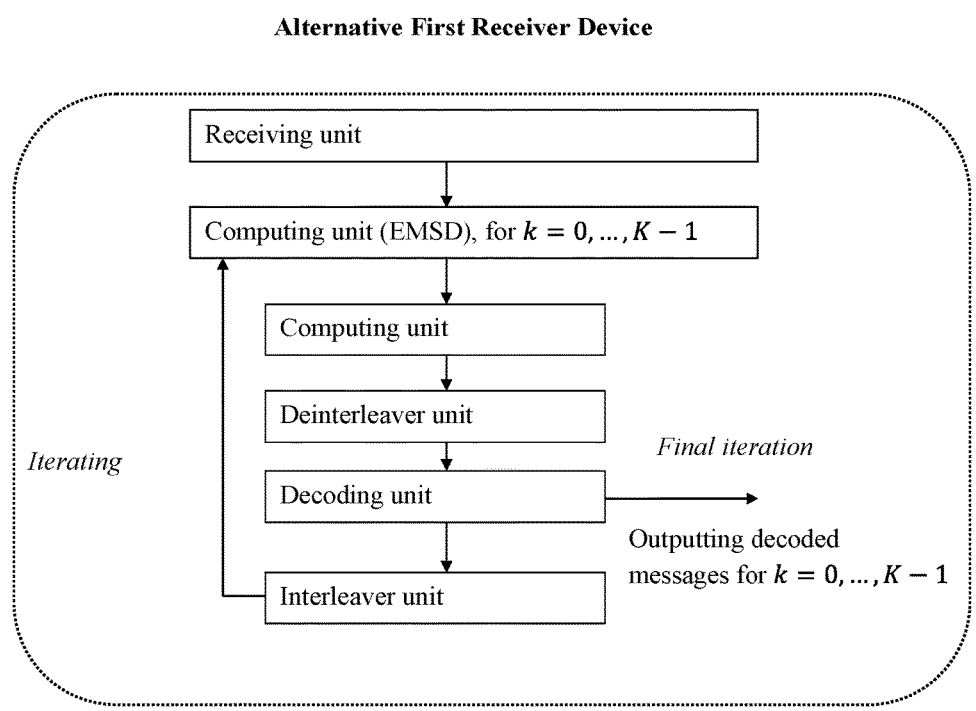
FIG. 18 illustrates an alternative first or second receiving device according to an embodiment of the present patent application.

Alternatively, according to another embodiment of the patent application the present receiver device comprises dedicated units for the performance of the method steps. This embodiment is illustrated in FIG. 18 in which the receiver device comprises dedicated units for the corresponding method steps. The device according to this embodiment comprises a receiving unit, an EMSD, computing units, deinterleaver units, decoding units, interleaver units, and outputting units.

The second receiver device of the present patent application can be arranged and implemented as the first receiver device except that the receiver signal in this case has been encoded and modulated according to a general Trellis Coded Multiple Access, TCMA, scheme.

The present transmission and receiver devices can all be modified, mutatis mutandis, to correspond to the different embodiments of the present transmission and receiver devices.

As an example relating to the transmitter device, according to an embodiment of the device, the K number of data streams is selected from a set of Z>K data streams based on the channel quality of said radio channel, such as signal-to-noise ratio.

According to another embodiment of the device, the K number of data streams experience substantially the same channel quality.

According to yet another embodiment of the device, the encoder parameters and/or the modulation scheme of the $TCM_k$ is dependent on the number of selected streams K.

According to yet another embodiment of the device, the $TCM_k$ encoder has four states for K≤3 and two states for K≥4.

According to yet another embodiment of the device, the modulation scheme is any in the group comprising: PSK, QAM, PAM, ASK and APSK.

According to yet another embodiment of the device, the interleavers $\Pi_k$ use any of: a set of randomly generated permutations; a set of permutations generated from circular shifts of a single randomly generated permutation; or a set of permutations generated according to the rule of quadratic polynomial permutation.

According to yet another embodiment of the device, the coefficients of the scrambling sequence are dependent on the number of selected streams K.

According to yet another embodiment of the device, the coefficients of the scrambling sequence for:

K=2, maximize the minimum Euclidean distance of the symbols of the signal constellation subject to symbol power constraint;

K∈{3,4,5}, are uniformly phase spaced in [0, $$\frac{\pi}{\mu})$$

where μ is a constant dependent on the modulation scheme; and

K≥6, are the coefficients of a complex pseudo-random sequence, such as a Zadoff-Chu sequence.

According to yet another embodiment of the device, μ is equal to one for BPSK, PAM, and ASK; two for QPSK and QAM; four for 8 PSK; and eight for 16 PSK.

According to yet another embodiment of the device, the number of selected streams is K≥2.

According to yet another embodiment of the device, the combining is achieved by summing all the scrambled data messages of the K number of data streams to form the at least one transmission signal s(l).

According to yet another embodiment of the device, each data message comprises a finite length sequence of information symbols or a block of information symbols.

According to yet another embodiment of the device, the wireless communication system is an OFDM system or a single carrier system.

According to yet another embodiment of the device, the K number of data streams uses the same TCM encoder parameters and/or modulation schemes.

This principle also relates to the first and second receiver devices, of the present patent application, in relation to their respective corresponding methods.

Finally, it should be understood that the present patent application is not limited to the embodiments described above, but also relates to and incorporates all embodiments within the scope of the appended independent claims.

The invention claimed is:

1. A transmission method in a wireless communication system, comprising:

selecting, by the wireless communication system, K data streams for transmission from a set of Z>K data streams based on a channel quality of a radio channel, wherein each data stream comprises one or more data messages;

for k-th data stream, wherein k=0, . . . , K−1:

encoding and modulating, by the wireless communication system, the one or more data messages of the k-th data stream using a Trellis Coded Modulation (TCM) scheme, $TCM_k$, to generate one or more processed data messages;

interleaving, by the wireless communication system, the one or more processed data messages of the k-th data stream using a stream specific interleaver $\Pi_k$; and scrambling, by the wireless communication system, the interleaved one or more processed data messages of the k-th data stream using a stream specific scrambling sequence, wherein coefficients of the scrambling sequence for K=2 maximize a minimum Euclidean distance of the symbols of a signal constellation subject to symbol power constraint, wherein the coefficients of the scrambling sequence for K∈{3,4,5}, are uniformly phase spaced in [0, $$\frac{\pi}{\mu})$$

where μ is a constant dependent on the $TCM_k$, and wherein the coefficients of the scrambling sequence for K≥6, are coefficients of a complex pseudo-random sequence;

combining, by the wireless communication system, scrambled data messages of the K data streams into at least one transmission signal s(l); and transmitting, by the wireless communication system, the at least one transmission signal s(l) over the radio channel of the wireless communication system.

2. The method according to claim 1, wherein the K data streams experience substantially a same channel quality.

3. The method according to claim 1, wherein encoding parameters of the $TCM_k$ are dependent on the K data streams.

4. The method according to claim 3, wherein the $TCM_k$ encoding has four states for K≤3 and two states for K≥4.

5. The method according to claim 1, wherein the interleavers $\Pi_k$ use any of a set of randomly generated permutations, a set of permutations generated from circular shifts of a single randomly generated permutation, or a set of permutations generated according to a rule of quadratic polynomial permutation.

6. The method according to claim 1, wherein μ is equal to one for BPSK, PAM, and ASK, wherein μ is equal to two for QPSK and QAM, wherein μ is equal to four for 8PSK, and wherein μ is equal to eight for 16PSK.

7. The method according to claim 1, wherein K≥2.

8. The method according to claim 1, wherein the combining is achieved by summing the scrambled data messages of the K data streams to form the at least one transmission signal s(l).

9. The method according to claim 1, wherein the at least one transmission signal s(l) is transmitted by a single transmission device.

10. The method according to claim 1, wherein the at least one transmission signal s(l) is transmitted by a plurality of independent transmission devices.

11. The method according to claim 1, wherein each data message comprises a finite length sequence of information symbols or comprises a block of information symbols.

12. The method according to claim 1, wherein the K data streams uses same $TCM_k$ encoding parameters.

13. The method according to claim 1, wherein a modulation scheme of the $TCM_k$ is dependent on the K data streams.

14. The method according to claim 1, wherein the K data streams uses a same $TCM_k$ modulation scheme.

15. A transmission device for processing and transmitting communication signals in a wireless communication system, comprising:

a non-transitory memory storage comprising instructions; and one or more processors in communication with the memory, wherein the one or more processors execute the instructions to:

select K data streams for transmission from a set of Z>K data streams based on a channel quality of a radio channel, wherein each data stream comprises one or more data messages;

for k-th data stream, wherein k=0, . . . , K−1:

encode and modulate the one or more data messages of the k-th data stream using a Trellis Coded Modulation (TCM) scheme, $TCM_k$, to generate one or more processed data messages;

interleave the one or more processed data messages of the k-th data stream using a stream specific interleaver $\Pi_k$; and scramble the interleaved one or more processed data messages of the k-th data stream using a stream specific scrambling sequence, wherein coefficients of the scrambling sequence for K=2 maximize a minimum Euclidean distance of the symbols of a signal constellation subject to symbol power constraint, wherein the coefficients of the scrambling sequence for K∈{3,4,5}, are uniformly phase spaced in [0, $$\left[0, \frac{\pi}{\mu}\right)$$

wherein μ is a constant dependent on the $TCM_k$, and wherein the coefficient of the scrambling sequence for K≥6, are coefficients of a complex pseudo-random sequence;

combine scrambled data messages of the K data streams into at least one transmission signal s(l); and transmit the at least one transmission signal s(l) over the radio channel of the wireless communication system.

16. The transmission device according to claim 15, wherein encoding parameters of the $TCM_k$ are dependent on the K data streams.

17. The transmission device according to claim 15, wherein the interleavers $\Pi_k$ use any of a set of randomly generated permutations, a set of permutations generated from circular shifts of a single randomly generated permutation, or a set of permutations generated according to a rule of quadratic polynomial permutation.

18. The transmission device according to claim 15, wherein coefficients of the scrambling sequence are dependent on the K data streams.

19. The transmission device according to claim 15, wherein a modulation scheme of the $TCM_k$ is dependent on the K data streams.

20. The transmission device according to claim 15, wherein the K data streams uses a same $TCM_k$ modulation scheme.

* * * * *

UNITED STATES PATENT AND TRADEMARK OFFICE
CERTIFICATE OF CORRECTION

PATENT NO. : 10,250,430 B2
APPLICATION NO. : 15/162922
DATED : April 2, 2019
INVENTOR(S) : Branislav M. Popovic and Alberto Giuseppe Perotti Page 1 of 1

It is certified that error appears in the above-identified patent and that said Letters Patent is hereby corrected as shown below:

In the Claims

In Column 24, Line 33, in Claim 15, after "in" delete "[0,".

Signed and Sealed this
Fourteenth Day of April, 2020

Andrei Iancu
*Director of the United States Patent and Trademark Office*